(12) United States Patent
Wang et al.

(10) Patent No.: US 9,543,897 B2
(45) Date of Patent: Jan. 10, 2017

(54) FULLY I/Q BALANCED QUADRATURE RADIO FREQUENCY MIXER WITH LOW NOISE AND LOW CONVERSION LOSS

(71) Applicant: QUALCOMM Incorporated, San Diego, CA (US)

(72) Inventors: Cheng-Han Wang, San Jose, CA (US); Alberto Cicalini, Viguzzolo (IT); Thinh Cat Nguyen, San Jose, CA (US); Mohammad Bagher Vahid Far, San Jose, CA (US); Jesse Aaron Richmond, Oakland, CA (US)

(73) Assignee: QUALCOMM Incorporated, San Diego, CA (US)

(*) Notice: Subject to any disclaimer, the term of this patent is extended or adjusted under 35 U.S.C. 154(b) by 49 days.

(21) Appl. No.: 14/622,591

(22) Filed: Feb. 13, 2015

(65) Prior Publication Data

US 2016/0241192 A1 Aug. 18, 2016

(51) Int. Cl.
*G06G 7/12* (2006.01)
*H03D 7/14* (2006.01)
*H03D 7/16* (2006.01)

(52) U.S. Cl.
CPC ............ *H03D 7/145* (2013.01); *H03D 7/1433* (2013.01); *H03D 7/1441* (2013.01); *H03D 7/1458* (2013.01); *H03D 7/1466* (2013.01); *H03D 7/165* (2013.01); *H03D 2200/0027* (2013.01)

(58) Field of Classification Search
CPC ... H03D 7/1458; H03D 7/1466; H03D 7/1491
USPC .......................... 327/355–360; 455/323, 326
See application file for complete search history.

(56) References Cited

U.S. PATENT DOCUMENTS

| 7,085,549 B2 | 8/2006 | Peterson et al. |
| 7,538,596 B2 | 5/2009 | Dornbusch |
| 7,750,749 B2* | 7/2010 | Jones ................... H03D 7/1441 327/359 |
| 8,072,255 B2* | 12/2011 | Cicalini ............... H03D 7/1441 327/113 |

(Continued)

FOREIGN PATENT DOCUMENTS

CN 101944881 A 1/2011

OTHER PUBLICATIONS

Mirzaei A., et al., "Analysis of Direct-Conversion IQ Transmitters With 25% Duty-Cycle Passive Mixers," IEEE Transactions on Circuits and Systems-I: Regular Papers, Oct. 2011, vol. 58 (10), pp. 2318-2331.

(Continued)

*Primary Examiner* — Dinh T Le
(74) *Attorney, Agent, or Firm* — Arent Fox LLP

(57) ABSTRACT

A method, an apparatus, and a system product for mixing radio frequency signals are provided. In one aspect, the apparatus is configured to perform switching of switches based on first, second, third, and fourth phased half duty clock signals. The apparatus convolves a differential input signal on a differential input port with the first, second, third, and fourth phased half duty cycle clock signals to concurrently generate a differential in-phase output signal and a differential quadrature-phase output signal on a dual differential output port. The first, second, third, and fourth phased half duty cycle clock signals are of the same frequency and out of phase by a multiple of ninety degrees with respect to each other.

28 Claims, 17 Drawing Sheets

(56) References Cited

U.S. PATENT DOCUMENTS

| | | | |
|---|---|---|---|
| 8,299,865 B2* | 10/2012 | Nakamura | H04L 27/36 |
| | | | 332/103 |
| 8,433,277 B2* | 4/2013 | Fenghao | H03D 7/1441 |
| | | | 455/171.1 |
| 8,525,573 B2 | 9/2013 | Cicalini | |
| 2007/0230558 A1 | 10/2007 | Sjoland et al. | |
| 2007/0264945 A1 | 11/2007 | Carrez | |

OTHER PUBLICATIONS

International Search Report and Written Opinion—PCT/US2016/017404—ISA/EPO—May 19, 2016.

* cited by examiner (BACKGROUND)

FULLY I/Q BALANCED QUADRATURE RADIO FREQUENCY MIXER WITH LOW NOISE AND LOW CONVERSION LOSS

FIELD

The embodiments of the disclosure relate generally to radio transmitters and radio receivers. More particularly, the embodiments of the disclosure relate to radio frequency (RF) mixers.

BACKGROUND

A radio frequency (RF) mixer is generally a three-port radio frequency component that is used to change the frequency of one of the input signals. In a radio transmitter, an RF mixer may also be referred to as an upconverter. When used in a radio receiver, an RF mixer may also be referred to as a downconverter.

An RF mixer may be an active component or a passive component. To achieve a small scale size, an RF mixer typically uses an active component formed of transistors receiving a power supply so that it may be integrated into integrated circuits with other radio frequency components and devices.

Referring now to background FIG. 1, a schematic symbol for an RF mixer 100 is illustrated. The mixer 100 has two inputs ports LO, IF/RF and one output port RF/IF. If being used as an upconverter, the input ports are a local oscillating input port LO and an intermediate frequency input port IF, and the output port is a radio frequency output port RF. If the mixer is being used as a downconverter, the input ports are a local oscillating input port LO and a radio frequency input port RF, and the output port is an intermediate frequency output port IF. The LO port receives a local oscillating signal from an oscillating signal source.

The purpose of a mixer is to change the frequency of a signal while maintaining other properties of the signal the same. In FIG. 1, a first signal is coupled into the IF/RF port of the mixer 100 at a particular frequency $f_1$. A carrier signal is coupled into the LO port of the mixer 100 at a second frequency $f_2$. Two different output signals are formed at the RF/IF output port of the mixer 100 that may be selectively used. For upconversion to a higher frequency output signal, the in-phase output signal with a frequency equal to the sum of the two input frequencies ($f_1+f_2$) is selected. For downconversion to a lower frequency output signal, the output signal with a frequency equal to the difference between the two input frequencies ($f_1-f_2$) is selected.

For example, sound waves of voice are in a low frequency range of 20 to 20,000 hertz. On the other hand, carrier frequencies of cellular communications systems are in much higher frequency bands, such as 900,000,000 hertz. To talk on a cellular phone, for example, the voice frequency needs to be upconverted to the cellular carrier frequency used in cellular communications. One or more mixers are used to change the frequency band or range of human voice to the frequency band of the cellular carrier frequency.

One important characteristic of a mixer is conversion gain. Conversion gain is the ratio of the amplitude of the output signal to the amplitude of the input signal (not the local oscillating LO signal). Conversion gain may be expressed as a power ratio. If the conversion gain is less than one (e.g., a fraction), there is actually a loss through the mixer.

Another important characteristic of a mixer is its noise figure (NF). The noise figure for a mixer is determined by dividing the signal-to-noise ratio (SNR) at the input port (not the local oscillating LO input port) by the signal-to-noise ratio (SNR) at the output port of the mixer and converting the ratio into decibels.

The overall NF of a receiver chain can be determined by the NF and gain of each stage in the receiver chain using Friis's Equation below, where $F_n$ is the noise factor and $G_n$ is the available power gain of a particular stage:

$$NF = 10\log(F) = 10\log\left(F_1 + \frac{F_2-1}{G_1} + \frac{F_3-1}{G_1 G_2} + \frac{F_4-1}{G_1 G_2 G_3} + \ldots\right)$$

Thus, a receiver chain NF can be improved by increasing the conversion gain and reducing the noise figure of any stage including the mixer. By increasing the conversion gain and reducing the noise figure in a mixer, the requirements for other RF components may be more relaxed leading to simpler designs using less integrated circuit die area and power conserving designs with the amplification of less noise.

Currently, 25% duty cycle LO generation is widely used because a 25% duty cycle LO driven mixer has been noted to reduce the gain loss of the mixer due to I/Q coupling. However, due to device speed limitations, 25% Duty Cycle LO generation may be difficult to implement, especially for high RF frequency applications. Accordingly, the present disclosure provides a technique for using a 50% duty cycle LO that prevents gain loss due to I/Q coupling.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved narrowband channel selection for devices in a wireless network.

One aspect of this disclosure provides a radio frequency mixer. The radio frequency mixer includes a first switching module configured to switch a differential input signal based on a first phased half duty cycle clock signal and a second phased half duty cycle clock signal to generate first switching outputs, and switch the differential input signal based on a third phased half duty cycle clock signal and a fourth phased half duty cycle clock signal to generate second switching outputs. The radio frequency mixer further includes a second switching module configured to generate a differential in-phase output signal and a differential quadrature-phase output signal on a dual differential output port by being configured to switch the first switching outputs based on the third phased half duty cycle clock signal and the fourth phased half duty cycle clock signal, and switch the second switching outputs based on the first phased half duty cycle clock signal and the second phased half duty cycle clock signal.

The first switching module includes a plurality of first switches including first control inputs, wherein a first subset of first switches of the plurality of first switches are coupled in parallel to a positive input of a differential input port and a second subset of first switches of the plurality of first switches are coupled in parallel to a negative input of the differential input port. The second switching module includes a plurality of parallel second switch pairs comprising second control inputs, wherein each pair of parallel second switches of a first subset of second switch pairs of the plurality of parallel second switch pairs is coupled in series to one respective first switch of the first subset of first switches and to the dual differential output port, and wherein each pair of parallel second switches of a second subset of second switch pairs of the plurality of parallel second switch pairs is coupled in series to one respective first switch of the second subset of first switches and to the dual differential output port.

The first control inputs of the first subset of first switches are configured to receive the first phased half duty cycle clock signal and the second phased half duty cycle clock signal to facilitate switching at the first subset of first switches. The second control inputs of the first subset of second switch pairs are configured to receive the third phased half duty cycle clock signal and the fourth phased half duty cycle clock signal to facilitate switching at the first subset of second switch pairs. The first control inputs of the second subset of first switches are configured to receive the third phased half duty cycle clock signal and the fourth phased half duty cycle clock signal to facilitate switching at the second subset of first switches. The second control inputs of the second subset of second switch pairs are configured to receive the first phased half duty cycle clock signal and the second phased half duty cycle clock signal to facilitate switching at the second subset of second switch pairs. The first, second, third, and fourth phased half duty cycle clock signals are of the same frequency and out of phase by a multiple of ninety degrees with respect to each other. The switching at the first subset of first switches, the switching at the first subset of second switch pairs, the switching at the second subset of first switches, and the switching at the second subset of second switch pairs convolves the differential input signal on the differential input port with the first, second, third, and fourth phased half duty cycle clock signals to concurrently generate the differential in-phase output signal and the differential quadrature-phase output signal on the dual differential output port.

Another aspect of this disclosure provides a radio frequency mixer. The radio frequency mixer includes a first switching module configured to receive first, second, third, and fourth phased half duty cycle clock signals. The first switching module is further configured to switch a differential input signal based on the third phased half duty cycle clock signal and the fourth phased half duty cycle clock signal to generate first switching outputs, switch the differential input signal based on the third phased half duty cycle clock signal and the fourth phased half duty cycle clock signal to generate second switching outputs, switch the differential input signal based on the first phased half duty cycle clock signal and the second phased half duty cycle clock signal to generate third switching outputs, and switch the differential input signal based on the first phased half duty cycle clock signal and the second phased half duty cycle clock signal to generate fourth switching outputs.

The radio frequency mixer further includes a second switching module configured to receive the first second, third, and fourth phased half duty cycle clock signals. The second switching module is configured to generate a differential in-phase output signal and a differential quadrature-phase output signal on a dual differential output port by being configured to switch the first switching outputs based on the first phased half duty cycle clock signal and the second phased half duty cycle clock signal, switch the second switching outputs based on the first phased half duty cycle clock signal and the second phased half duty cycle clock signal, switch the third switching outputs based on the third phased half duty cycle clock signal and the fourth phased half duty cycle clock signal, and switch the fourth switching outputs based on the third phased half duty cycle clock signal and the fourth phased half duty cycle clock signal.

The first switching module includes a plurality of first switches comprising first control inputs, wherein a first subset of first switches of the plurality of first switches are coupled in parallel to a positive input of a differential input port, a second subset of first switches of the plurality of first switches are coupled in parallel to a negative input of the differential input port, a third subset of first switches of the plurality of first switches are coupled in parallel to the positive input of the differential input port, and a fourth subset of first switches of the plurality of first switches are coupled in parallel to the negative input of the differential input port.

The second switching module includes a plurality of parallel second switch pairs comprising second control inputs, wherein each pair of parallel second switches of a first subset of second switch pairs of the plurality of parallel second switch pairs is coupled in series to one respective first switch of the first subset of first switches and to the dual differential output port, wherein each pair of parallel second switches of a second subset of second switch pairs of the plurality of parallel second switch pairs is coupled in series to one respective first switch of the second subset of first switches and to the dual differential output port, wherein each pair of parallel second switches of a third subset of second switch pairs of the plurality of parallel second switch pairs is coupled in series to one respective first switch of the third subset of first switches and to the dual differential output port, and wherein each pair of parallel second switches of a fourth subset of second switch pairs of the plurality of parallel second switch pairs is coupled in series to one respective first switch of the fourth subset of first switches and to the dual differential output port.

The first control inputs of the third subset of first switches are configured to receive the first phased half duty cycle clock signal and the second phased half duty cycle clock signal to facilitate switching at the third subset of first switches. The second control inputs of the third subset of second switch pairs are configured to receive the third phased half duty cycle clock signal and the fourth phased half duty cycle clock signal to facilitate switching at the third subset of second switch pairs.

The first control inputs of the fourth subset of first switches are configured to receive the first phased half duty cycle clock signal and the second phased half duty cycle clock signal to facilitate switching at the fourth subset of first switches. The second control inputs of the fourth subset of second switch pairs are configured to receive the third phased half duty cycle clock signal and the fourth phased half duty cycle clock signal to facilitate switching at the fourth subset of second switch pairs.

The first control inputs of the first subset of first switches are configured to receive the third phased half duty cycle clock signal and the fourth phased half duty cycle clock signal to facilitate switching at the first subset of first switches. The second control inputs of the first subset of second switch pairs are configured to receive the first phased half duty cycle clock signal and the second phased half duty cycle clock signal to facilitate switching at the first subset of second switch pairs.

The first control inputs of the second subset of first switches are configured to receive the third phased half duty cycle clock signal and the fourth phased half duty cycle clock signal to facilitate switching at the second subset of first switches. The second control inputs of the second subset of second switch pairs are configured to receive the first phased half duty cycle clock signal and the second phased half duty cycle clock signal to facilitate switching at the second subset of second switch pairs.

The first, second, third, and fourth phased half duty cycle clock signals are of the same frequency and out of phase by a multiple of ninety degrees with respect to each other. The switching at the first subset of first switches, the switching at the first subset of second switch pairs, the switching at the second subset of first switches, the switching at the second subset of second switch pairs, the switching at the third subset of first switches, the switching at the third subset of second switch pairs, the switching at the fourth subset of first switches, and the switching at the fourth subset of second switch pairs convolves the differential input signal on the differential input port with the first, second, third, and fourth phased half duty cycle clock signals to concurrently generate the differential in-phase output signal and the differential quadrature-phase output signal on the dual differential output port.

DETAILED DESCRIPTION

Figure 1:
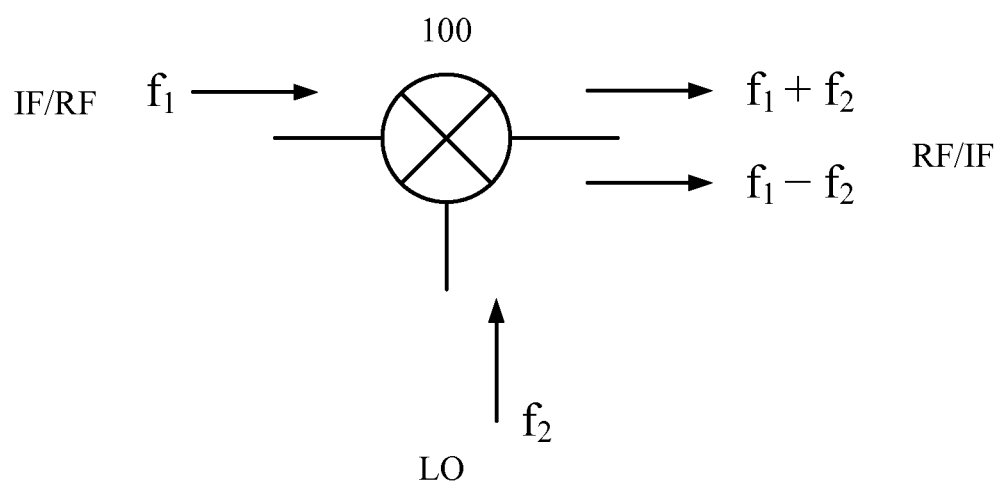
FIG. 1 is a background figure illustrating a schematic symbol of a radio frequency mixer.

In the following detailed description of the aspects of the disclosure, numerous specific details are set forth in order to provide a thorough understanding of the present disclosure. However, it will be obvious to one skilled in the art that the embodiments of the disclosure may be practiced without these specific details. In other instances well known methods, procedures, components, and circuits have not been described in detail so as not to unnecessarily obscure aspects of the aspects of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

The aspects of the disclosure include a method, apparatus and system for a balanced fifty percent duty cycle mixer with a transfer function providing low noise and low conversion loss.

A 25% duty cycle Passive Mixer generates very little noise and has a lower conversion loss compared to a 50% duty cycle Passive Mixer, both of which are desirable qualities in RF mixers. However, a 25% duty cycle mixer may be susceptible to I/Q mismatch and suffers from having a very stringent requirement of rise time and fall time of the signal on the local oscillator port. Additionally, for very high RF frequency applications such as 5G Un-Licensed Band, it is relatively difficult to generate a well controlled set of four 25% duty cycle rectangular waveforms for operation of a 25% duty cycle mixer. Thus, it is desirable to design a mixer that operates with square waveforms having a 50% duty cycle with an internally generated transfer function of a 25% duty cycle mixer to achieve low noise and low conversion loss. The present disclosure provides for a fully symmetric or partially symmetric mixer architecture which improves I/Q balance and 1/f noise.

Figure 2:
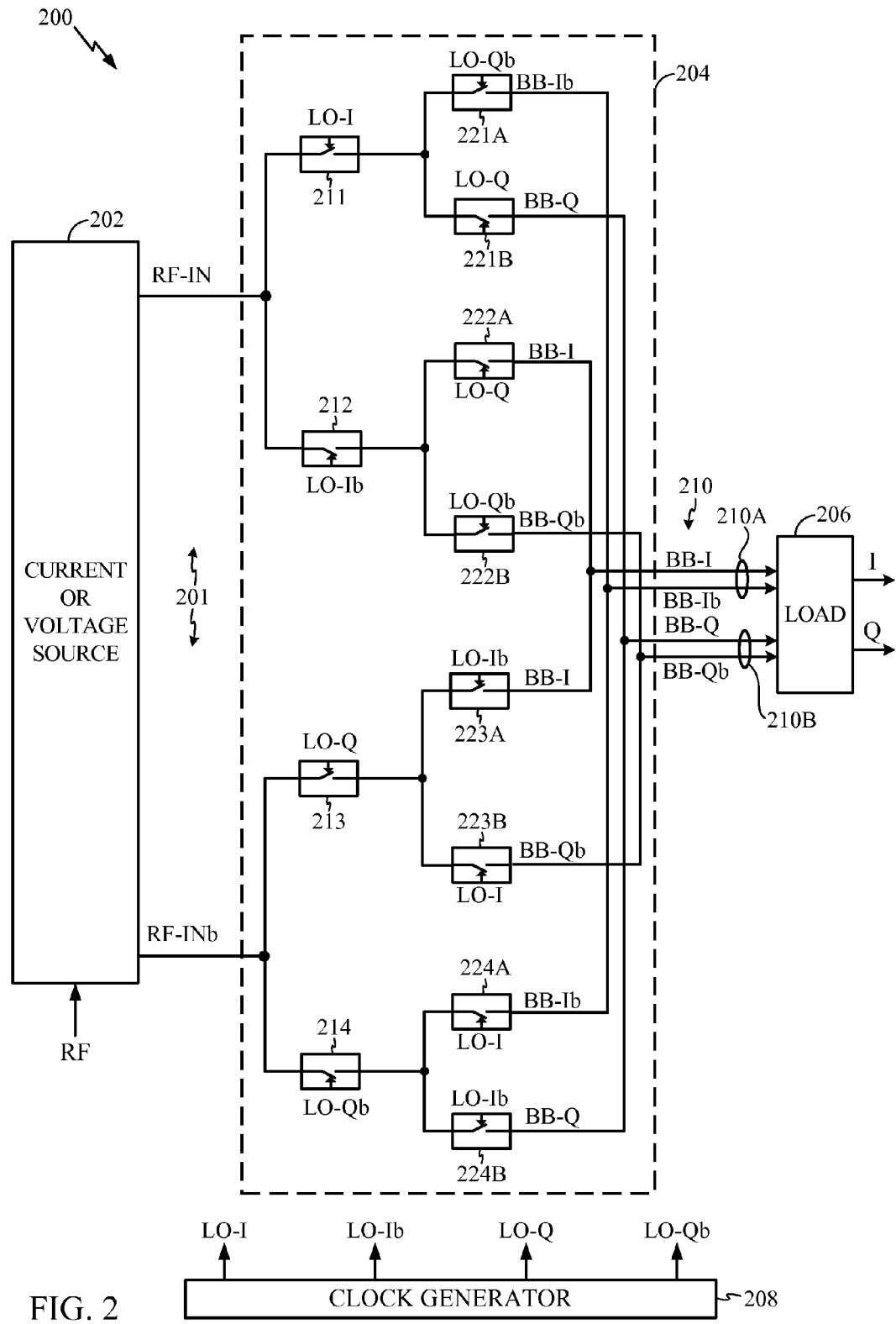
FIG. 2 is a functional block diagram of an example of a four phase half (50%) duty cycle quadrature mixer system.

Referring now to FIG. 2, a functional block diagram of a first example of a four phase half (50%) duty cycle quadrature mixer system 200 is illustrated. The system 200 includes an electrical (e.g., current or voltage) differential signal source 202, a first example of a four phase half (50%) duty cycle quadrature mixer 204, a dual differential electrical (e.g., current or voltage respectively) load 206, and a four phase clock generator or local oscillator 208 coupled together as shown. In an integrated circuit, conductive traces in one or more layers may be used to couple the elements of the system together. The four phase half duty cycle quadrature mixer 204 may be referred to as a partially symmetric mixer architecture.

The electrical (e.g., current or voltage) differential signal source 202 provides a differential current or voltage signal on RF-IN and RF-INb that is proportional to an RF input signal or an IF input signal, for example. The differential current or voltage signal is coupled into the mixer 204.

The four phase half duty cycle mixer 204 has a double ended or differential input port 201 to receive the differential current or voltage input signal on RF-IN and RF-INb. The mixer 204 has a dual differential output port 210 including a first in-phase (I) differential output port (BB-I, BB-Ib) 210A and a second quadrature-phase (Q) differential output port (BB-Q, BB-Qb) 210B. The mixer 204 further receives the four phased half duty cycle clock signals LO-I, LO-Ib, LO-Q, and LO-Qb from the clock generator 208.

The dual differential electrical (e.g., current or voltage respectively) load 206 is coupled to the dual differential in-phase/quadrature-phase output port 210 of the mixer 204. If the differential signal source 202 is providing a differential current signal source, the dual differential electrical load 206 is a current type loading so that current flows as a signal through the mixer from the differential input port to the dual differential output port. If the differential signal source 202 is providing a differential voltage signal source, the load 206 is a voltage type loading so a voltage presented as a signal at the differential input port is coupled through the mixer to the differential output port.

The dual differential output load 206 not only provides the proper loads but may also convert the differential input signals into single ended output signals. For example, the differential in-phase output signal (BB-I, BB-Ib) may be converted into the in-phase output signal I and the differential quadrature-phase output signal (BB-Q, BB-Qb) may be converted into the quadrature-phase output signal Q.

As a current or voltage may be used with the mixer 204, the differential current or voltage source 202 may be referred to as an electrical differential signal source 202 and the dual differential current or voltage load 206 may be referred to as a dual differential electrical load 206.

The mixer 204 includes first level switches 211-214 and second level switches 221A-224A and 221B-224B coupled together as shown. The first level switches 211-214 may be part of a first switching module of the mixer 204. The second level switches 221A-224A and 221B-224B may be part of a second switching module of the mixer 204. Switches 211-214, coupled in parallel to the differential input port 201, are at a first level of switches in the mixer and coupled in series to respective pairs of parallel switches 221A-221B, 222A-222B, 223A-223B, 224A-224B, coupled in parallel to the dual differential in-phase/quadrature-phase output port 210, at a second level of switches in the mixer. In the mixer, the first level of switches cascade into respective second level of switches between the differential input port 201 and the dual differential I and Q output port 210. For example, the output of switch 211 couples in series to the input of the pair of parallel switches 221A-221B. The output of switch 212 couples in series to the input of the pair of parallel switches 222A-222B. The output of switch 213 couples in series to the input of the pair of parallel switches 223A-223B. The output of switch 214 couples in series to the input of the pair of parallel switches 224A-224B.

More particularly, switches 211, 221A are coupled in series between the differential input port (RF-IN) 201 and the in-phase differential output port (BB-Ib) 210A. Switches 211, 221B are coupled in series between the differential input port (RF-IN) 201 and the quadrature-phase differential output port (BB-Q) 210B.

Switches 212, 222A are coupled in series between the differential input port (RF-IN) 201 and the in-phase differential output port (BB-I) 210A. Switches 212, 222B are coupled in series between the differential input port (RF-IN) 201 and the quadrature-phase differential output port (BB-Qb) 210B.

Switches 213, 223A are coupled in series between the differential input port (RF-INb) 201 and the in-phase differential output port (BB-I) 210A. Switches 213, 223B are coupled in series between the differential input port (RF-INb) 201 and the quadrature-phase differential output port (BB-Qb) 210B.

Switches 214, 224A are coupled in series between the differential input port (RF-INb) 201 and the in-phase differential output port (BB-Ib) 210A. Switches 214, 224B are coupled in series between the differential input port (RF-INb) 201 and the quadrature-phase differential output port (BB-Q) 210B.

Due to the coupling of the switches, the mixer 204 may also be referred to as a cascade switching mixer or a cascade doubled balanced switching mixer. The mixer 204 may be considered a passive mixer as typically power is not directly supplied to the switches.

The switches 211-214, 221A-224A, 221B-224B have a respective control input coupled to one of the four phased half duty cycle clock or local oscillating signals LO-I, LO-Ib, LO-Q, and LO-Qb as shown in FIG. 2. The first level of switches 211-214 have one of the LO-I, LO-Ib, LO-Q, or LO-Qb local oscillating signals coupled to their control inputs. The local oscillator signal LO-I is coupled to the control input of switch 211. The local oscillator signal LO-Ib is coupled to the control input of switch 212. The local oscillator signal LO-Q is coupled to the control input of switch 213. The local oscillator signal LO-Qb is coupled to the control input of switch 214. The second level of switches 221A-224A and 221B-224B also have one of the LO-I, LO-Ib, LO-Q, or LO-Qb local oscillating signals coupled to their control inputs. The local oscillator signal LO-I is coupled to the control input of switches 223B and 224A. The local oscillator signal LO-Ib is coupled to the control input of switches 223A and 224B. The local oscillator signal LO-Q is coupled to the control input of switches 221B and 222A. The local oscillator signal LO-Qb is coupled to the control input of switches 221A and 222B.

The switching activity of the first level switches 211-214 and the second level switches 221A-224A, 221B-224B in response to the four phased half duty cycle clock or local oscillating signals LO-I, LO-Ib, LO-Q, and LO-Qb is described with reference to FIGS. 3A-3D and 4A-4D. The switching activity of the switches in the mixer 204 in response to the four phased half duty cycle clocks, convolves/multiplies the differential input signal with the four phased half duty cycle clocks in the time/frequency domain to concurrently generate a differential in-phase (I) signal on the in-phase differential output 210A of the dual differential in-phase/quadrature-phase output port 210 and a differential quadrature-phase (Q) signal on the quadrature-phase differential output 210B of the dual differential in-phase/quadrature-phase output port 210. With the differential in-phase (I) signal and the differential quadrature-phase (Q) signal being concurrently generated by the same mixer 204, less circuit area may used and improvements in the performance of the mixer can be obtained.

The current or voltage load 206 is coupled to the dual differential in-phase/quadrature-phase output port 210 of the mixer 204.

The clock generator 208 generates the four phased half duty cycle clock or local oscillating signals LO-I, LO-Ib, LO-Q, and LO-Qb such as shown in FIGS. 4A-4D. The four phased half duty cycle clock or local oscillating signals LO-I, LO-Ib, LO-Q, and LO-Qb are each out of phase from each other by a multiple of ninety degrees. For example, the local oscillating signal LO-I is out of phase from the local oscillating signal LO-Q by a multiple of one or ninety degrees. The local oscillating signal LO-I is out of phase from the local oscillating signal LO-Ib by a multiple of two or one-hundred eighty degrees. The local oscillating signal LO-I is out of phase from the local oscillating signal LO-Qb by a multiple of three or two-hundred seventy degrees. The four phased half duty cycle clock or local oscillating signals LO-I, LO-Ib, LO-Q, and LO-Qb are each a square waveform with a fifty percent (50%) duty cycle.

Figure 4A:
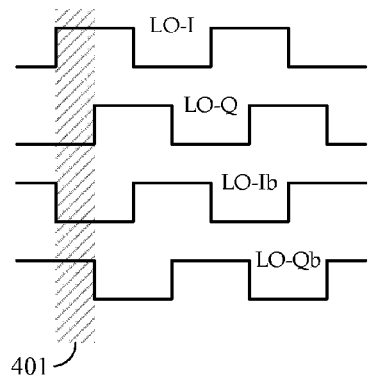
FIGS. 4A-4D are waveform diagrams of the four phased half duty cycle clock or local oscillating signals illustrating each of four phases.

Referring now to FIG. 4A, a first phase 401 is generated by the clock generator 208. In the first phase 401, the local oscillating signals LO-I and LO-Qb are logically high (e.g., a logical one) and the local oscillating signals LO-Q and LO-Ib are logically low (e.g., a logical zero).

Figure 4B:
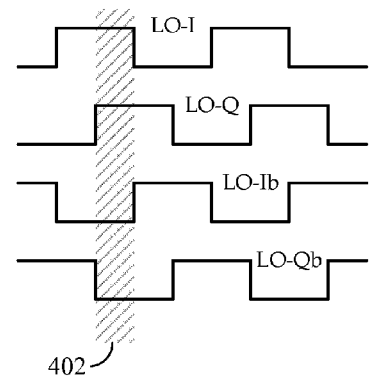

Referring now to FIG. 4B, a second phase 402 is generated by the clock generator 208. In the second phase 402, the local oscillating signals LO-I and LO-Q are logically high (e.g., a logical one) and the local oscillating signals LO-Qb and LO-Ib are logically low (e.g., a logical zero).

Figure 4C:
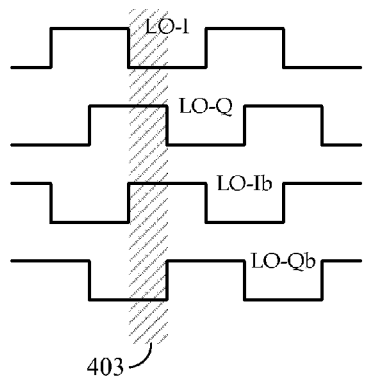

Referring now to FIG. 4C, a third phase 403 is generated by the clock generator 208. In the third phase 403, the local oscillating signals LO-Ib and LO-Q are logically high (e.g., a logical one) and the local oscillating signals LO-Qb and LO-I are logically low (e.g., a logical zero).

Figure 4D:
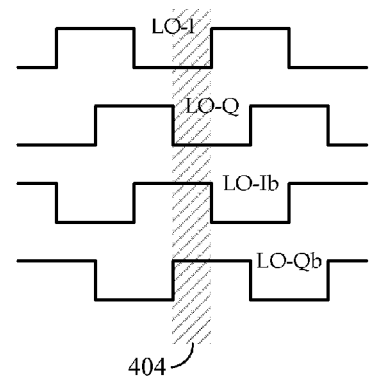

Referring now to FIG. 4D, a fourth phase 404 is generated by the clock generator 208. In the fourth phase 404, the local oscillating signals LO-Ib and LO-Qb are logically high (e.g., a logical one) and the local oscillating signals LO-Q and LO-I are logically low (e.g., a logical zero).

The operation of the first example of the four phase half duty cycle mixer 204 is now described with reference to FIGS. 3A-3D and 4A-4D.

Generally, the four phased half duty cycle clocks (LO-I, LO-Ib, LO-Q, LO-Qb) are generated with each being out of phase by a multiple of ninety degrees from the others. The four phased half duty cycle clocks are coupled into a four phase half duty cycle mixer 204. The switches in the four phase half duty cycle mixer are switched in response to the four phased half duty cycle clocks to convolve a differential input signal 201 with the four phased half duty cycle clocks to concurrently generate a differential in-phase output signal I and a differential quadrature-phase output signal Q on the dual differential output port (BB-I, BB-Ib) (BB-Q, BB-Qb) 210.

Figure 3A:
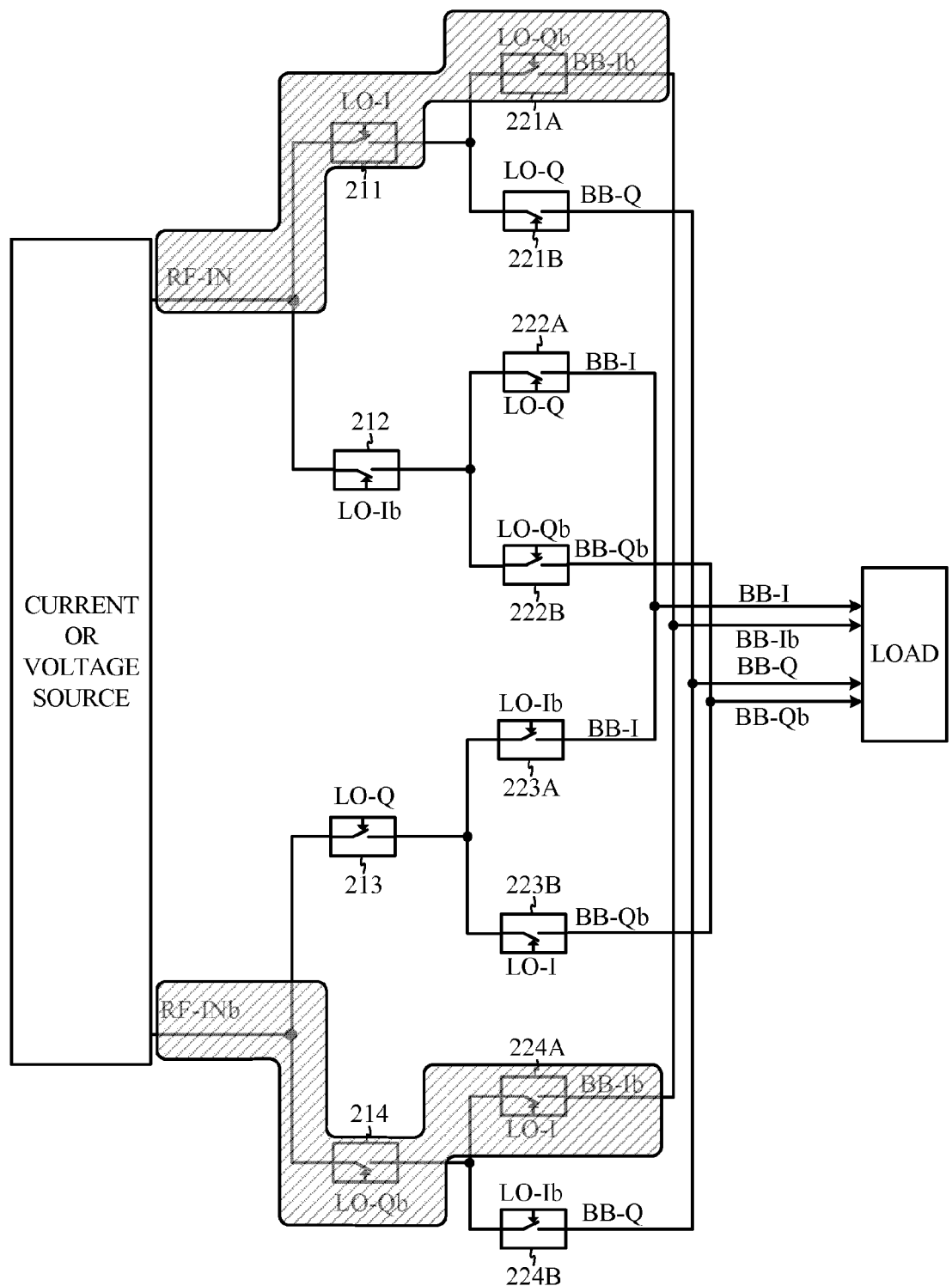
FIGS. 3A-3D illustrate the switching activity of the switches in the mixer shown in FIG. 2 in response to the four phased half duty cycle clocks.

Referring to FIGS. 2, 3A, and 4A, in the first phase 401 with the local oscillating signals LO-I and LO-Qb logically high (e.g., a logical one), switches 211, 221A are both respectively closed such that the positive RF input terminal RF-IN passes through the mixer 204 to the negative in-phase output terminal BB-Ib which is coupled into the load 206. Switches 214, 224A are also closed such that negative RF input terminal RF-INb passes through the mixer 204 to the negative in-phase output terminal BB-Ib coupled into the load 206.

Figure 3B:
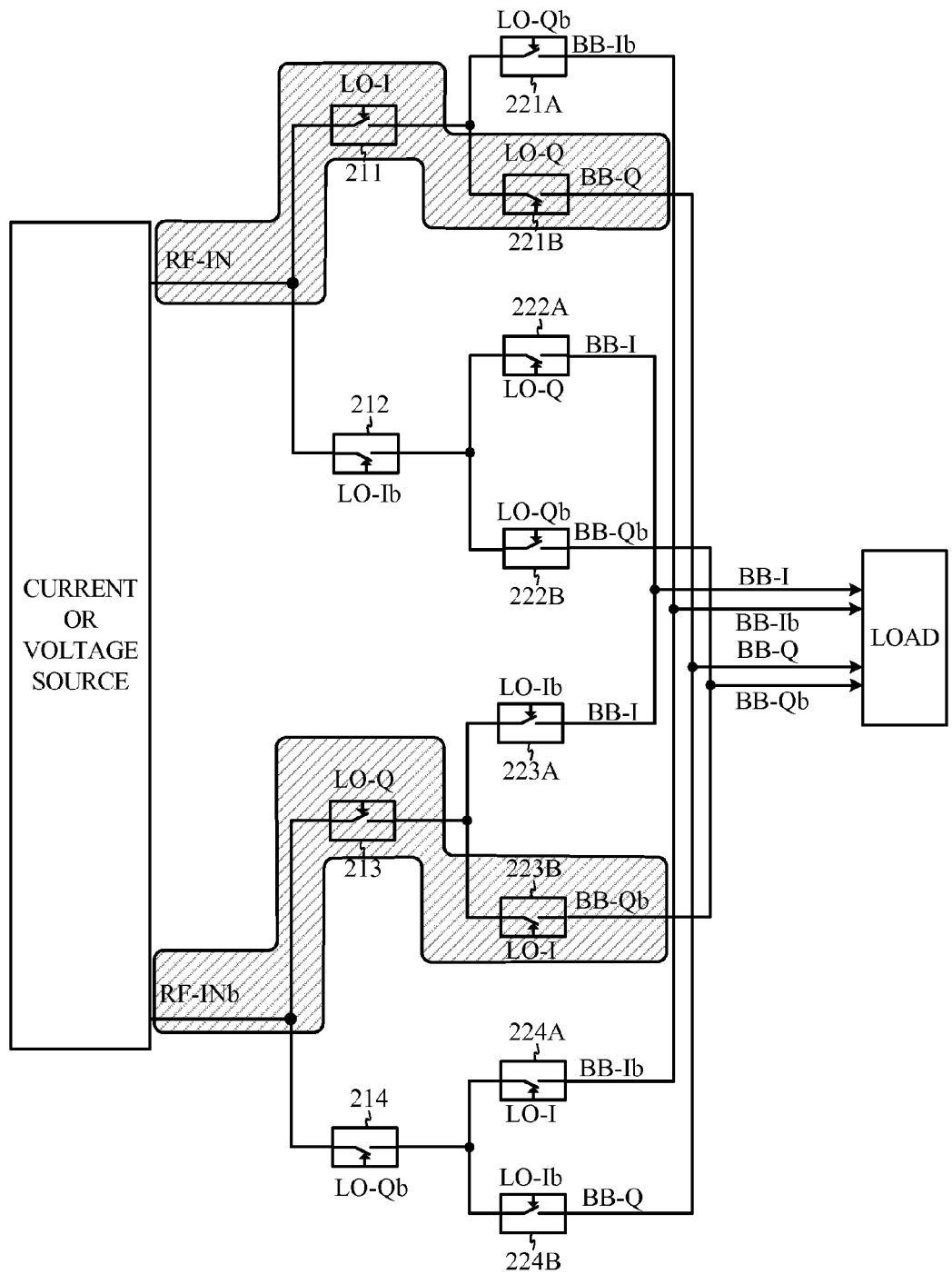

Referring to FIGS. 2, 3B, and 4B, in the second phase 402 with the local oscillating signals LO-I and LO-Q logically high (e.g., a logical one), switches 211, 221B are both closed such that the positive RF input terminal RF-IN passes through the mixer 204 to the positive quadrature-phase output terminal BB-Q coupled into the load 206. Switches 213, 223B are both also closed such that the negative RF input terminal RF-INb passes through the mixer 204 to the negative quadrature-phase output terminal BB-Qb coupled into the load 206.

Figure 3C:
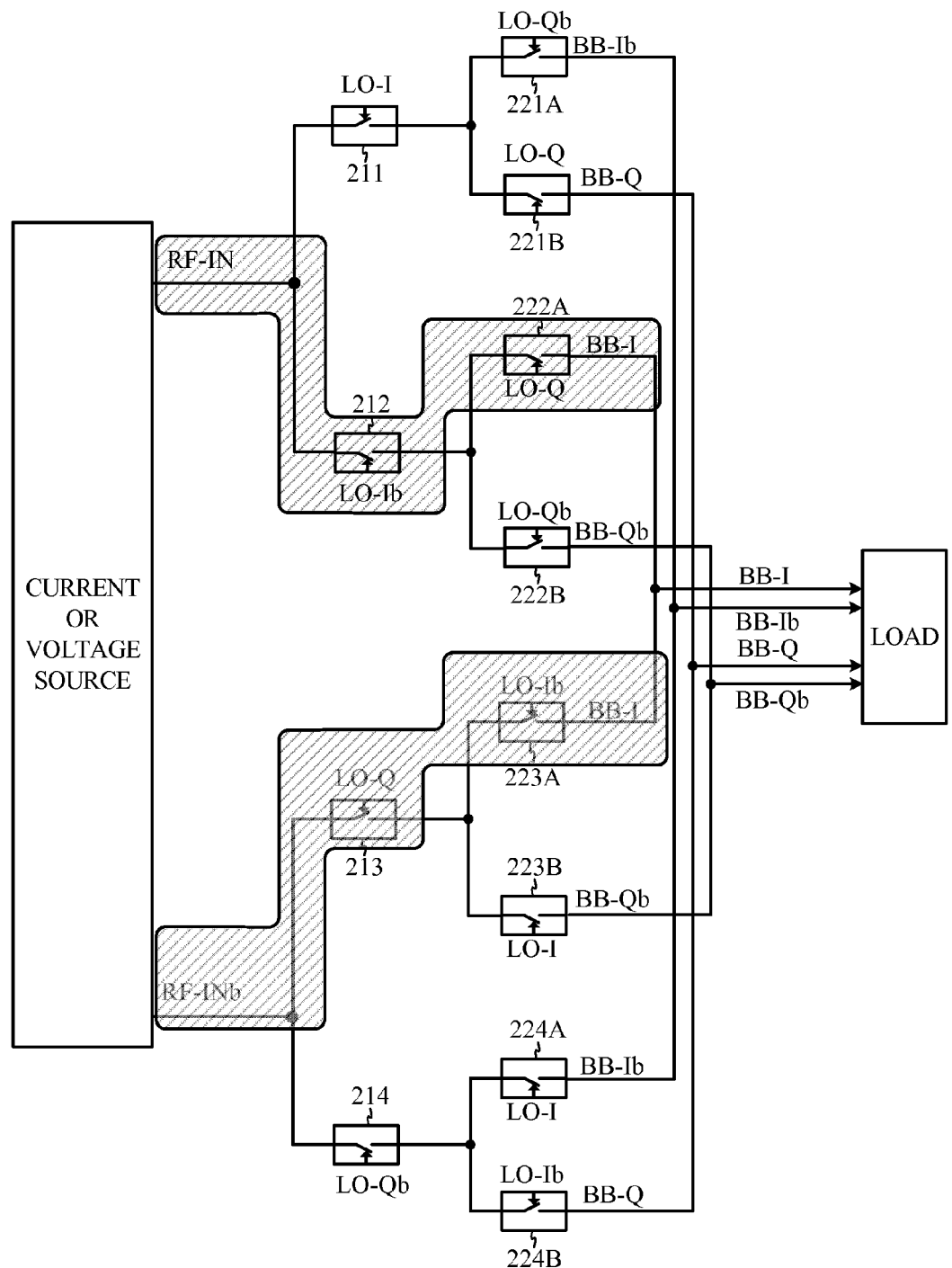

Referring to FIGS. 2, 3C, and 4C, in the third phase 403 with the local oscillating signals LO-Ib and LO-Q logically high (e.g., a logical one), switches 212, 222A are both closed such that positive RF input terminal RF-IN passes through the mixer 204 to the positive in-phase output terminal BB-I coupled into the load 206. Switches 213, 223A are both also closed such that the negative RF input terminal RF-INb passes through the mixer 204 to the positive in-phase output terminal BB-I coupled into the load 206.

Figure 3D:
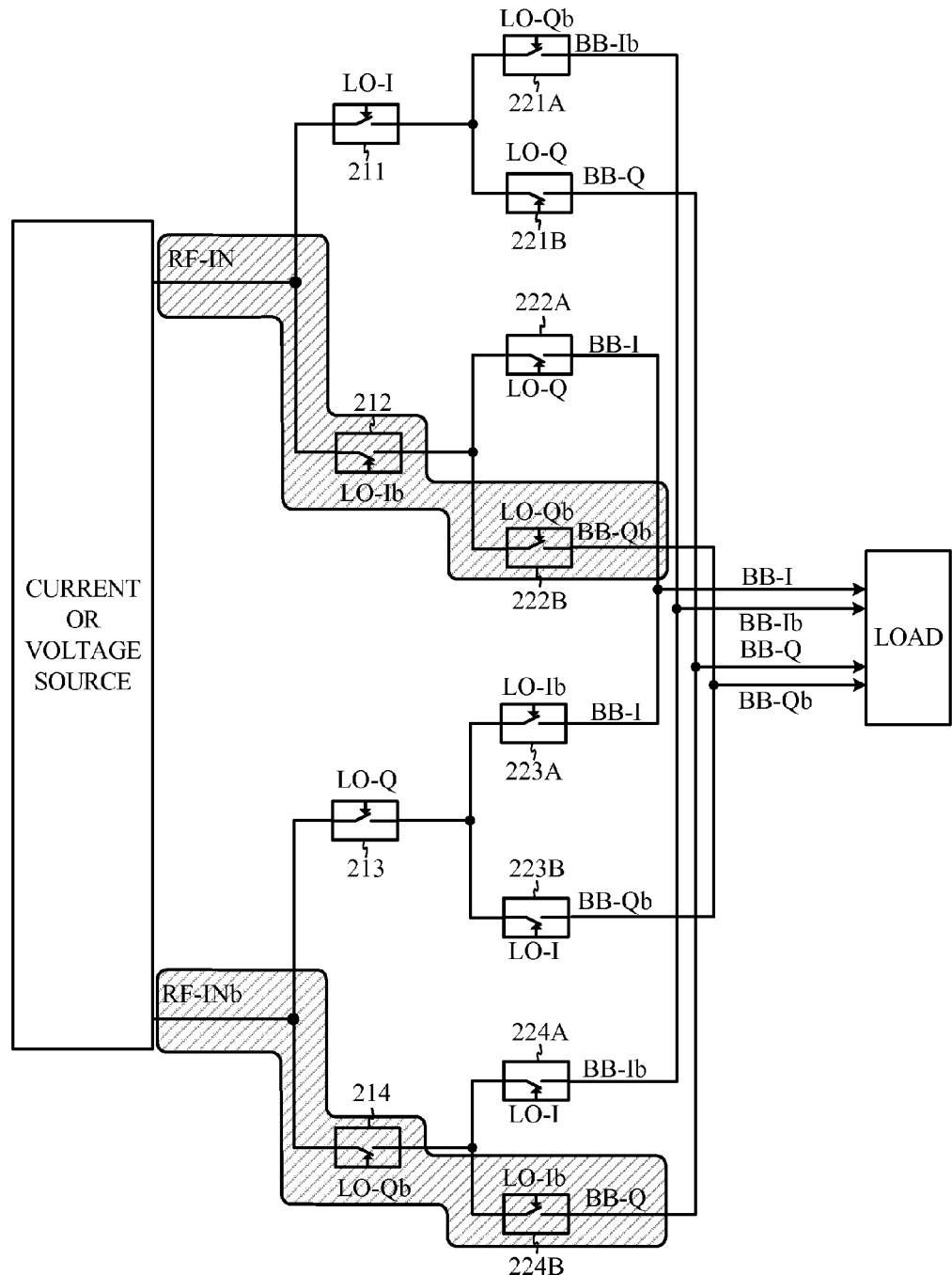

Referring to FIGS. 2, 3D, and 4D, in the fourth phase 404 with the local oscillating signals LO-Ib and LO-Qb logically high (e.g., a logical one), switches 212, 222B are both closed such that positive RF input terminal RF-IN passes through the mixer 204 to the negative quadrature-phase output terminal BB-Qb coupled into the load 206. Switches 214, 224B are both also closed such that the negative RF input terminal RF-INb passes through the mixer 204 to the positive quadrature-phase output terminal BB-Q coupled into the load 206.

The four phases of the local oscillating signals are generated over and over again to repeat the switching sequence of the transistors in the mixer 204 and the respective paths through the mixer.

Figure 5:
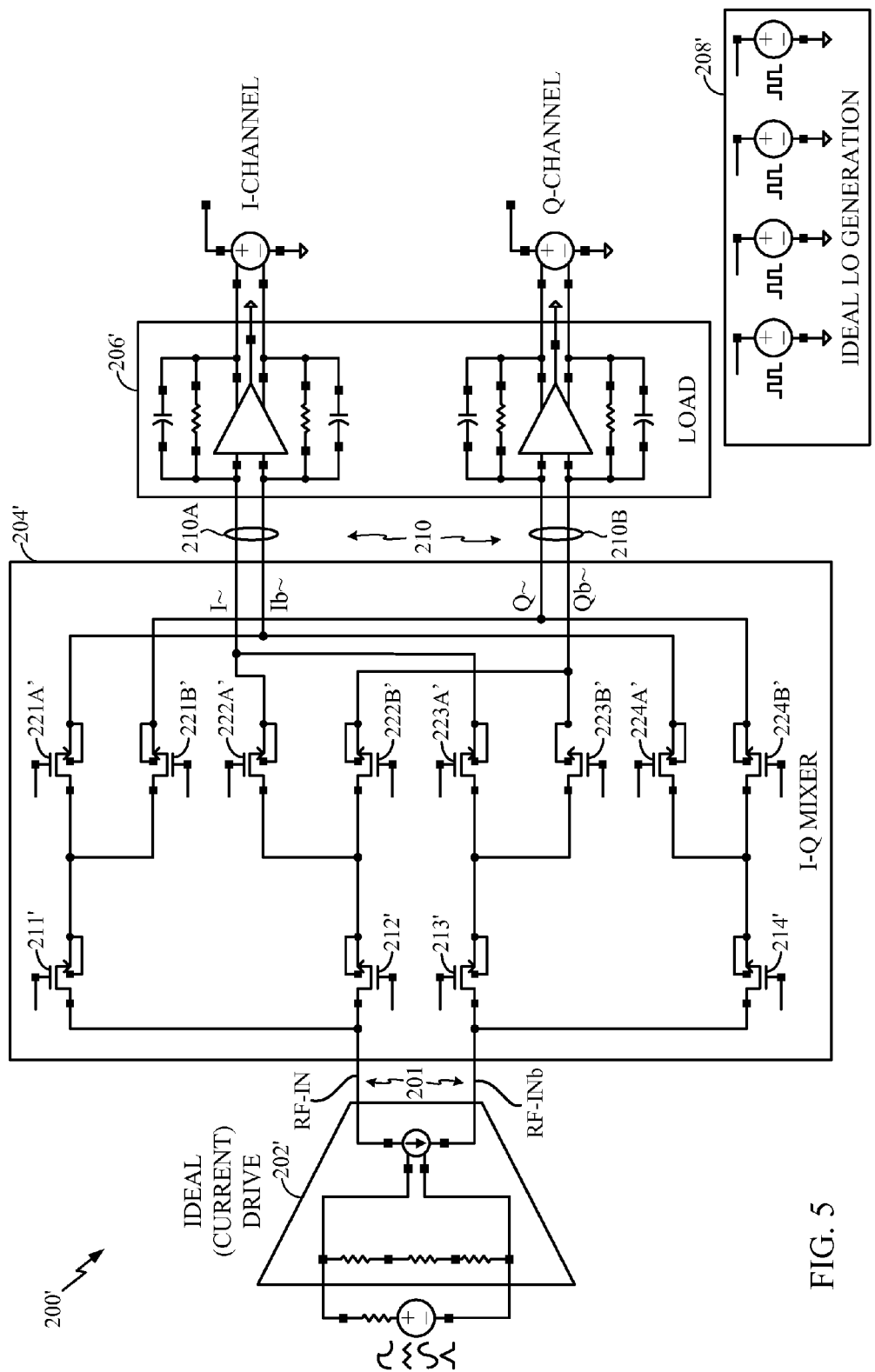
FIG. 5 is a schematic diagram illustrating an exemplary implementation of the mixer illustrated in the four phase half (50%) duty cycle quadrature mixer system of FIG. 2.

FIG. 5 illustrates a schematic diagram of an implementation of a mixer system 200'. The mixer system 200' includes the mixer 204' implemented with NFETs 803 (see FIG. 8) along with the ideal current drive 202', an ideal LO generator 208', and dual port load 206' for simulating the mixer 204'.

The mixer 204' includes NFETs 211'-214', 221A'-224A', and 221B'-224B' coupled together as shown in FIG. 5. The NFETs 211'-214', 221A'-224A', and 221B'-224B' of mixer 204' respectively correspond to switches 211-214, 221A-224A, and 221B-224B of mixer 204 described previously with reference to FIG. 2. The function of the mixer 204' is substantially similar to the function of mixer 204 and is not repeated here for reasons of brevity.

Figure 6:
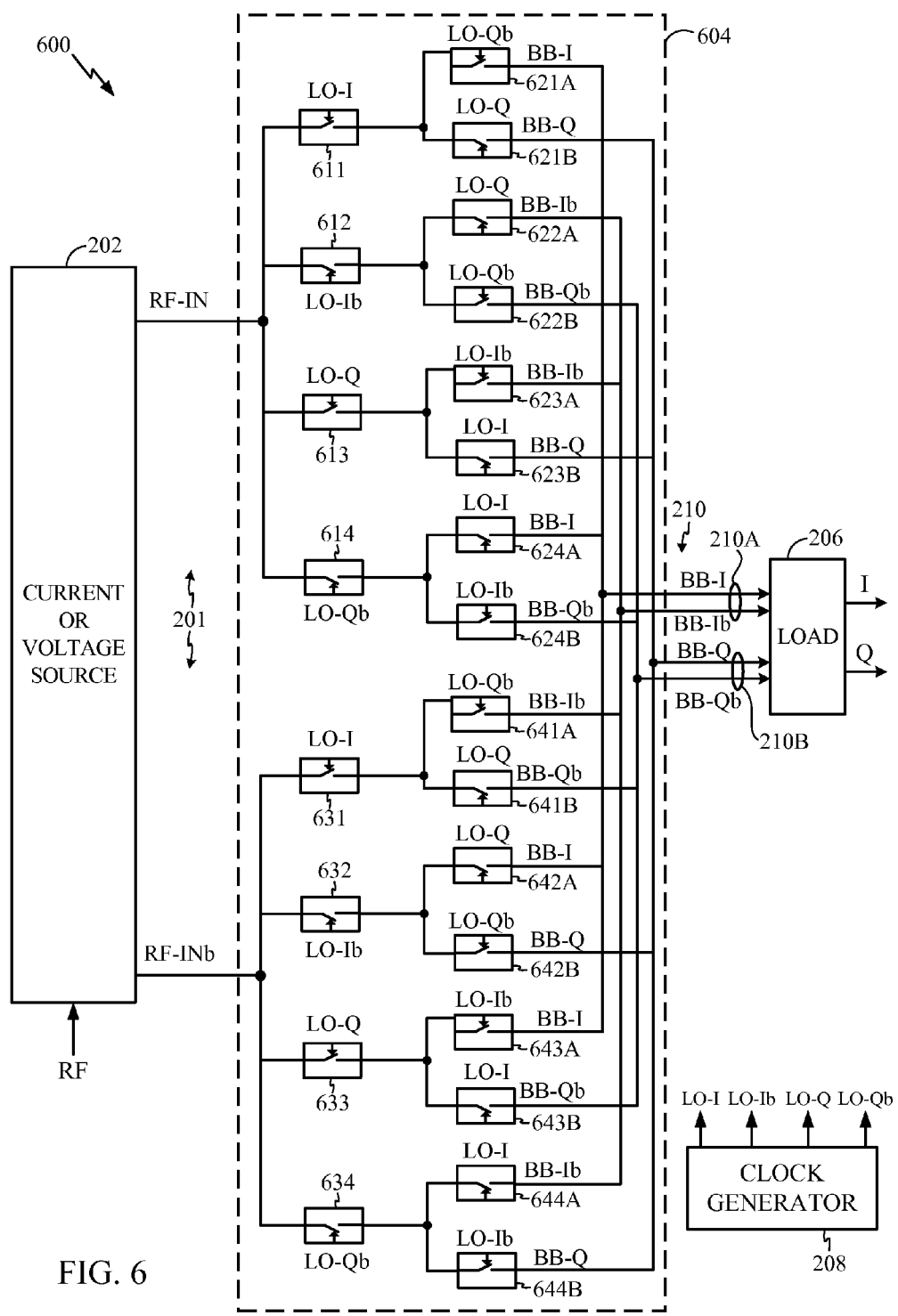
FIG. 6 is a functional block diagram of another example of a four phase half (50%) duty cycle quadrature mixer system.

Referring now to FIG. 6, a functional block diagram of a second example of a four phase half (50%) duty cycle quadrature mixer system 600 is illustrated. The system 600 includes an electrical (e.g., current or voltage) differential signal source 202, a second example of a four phase half (50%) duty cycle quadrature mixer 604, a dual differential electrical (e.g., current or voltage respectively) load 206, and a four phase clock generator or local oscillator 208 coupled together as shown. The four phase half duty cycle quadrature mixer 604 may be referred to as a fully symmetric mixer architecture that has no floated nodes, is I/Q fully balanced, and has no DC imbalance.

The electrical differential signal source 202, the dual differential electrical load 206, and the four phase clock generator 208 are described above with the same reference numbers. Therefore, their descriptions will not be repeated for reasons of brevity.

The four phase half duty cycle mixer 604 has a double ended or differential input port 201 to receive the differential current or voltage input signal on RF-IN and RF-INb. The mixer 604 has a dual differential output port 210 including a first in-phase (I) differential output port (BB-I, BB-Ib) 210A and a second quadrature-phase (Q) differential output port (BB-Q, BB-Qb) 210B. The mixer 604 further receives the four phased half duty cycle clock signals LO-I, LO-Ib, LO-Q, and LO-Qb from the clock generator 208.

The mixer 604 includes first level switches 611-614 and second level switches 621A-624A and 621B-624B coupled together as shown. The first level switches 611-614 may be part of a first switching module of the mixer 604. The second level switches 621A-624A and 621B-624B may be part of a second switching module of the mixer 604. The mixer 604 further includes first level switches 631-634 and second level switches 641A-644A and 641B-644B. The first level switches 631-634 may be part of the first switching module of the mixer 604. The second level switches 641A-644A and 641B-644B may be part of the second switching module of the mixer 604. Switches 611-614, coupled in parallel to the differential input port 201, are at a first level of switches in the mixer and coupled in series to respective pairs of parallel switches 621A-621B, 622A-622B, 623A-623B, 624A-624B, coupled in parallel to the dual differential in-phase/quadrature-phase output port 210, at a second level of switches in the mixer. Switches 631-634, coupled in parallel to the differential input port 201, are also at the first level of switches in the mixer and coupled in series to respective pairs of parallel switches 641A-641B, 642A-642B, 643A-643B, 644A-644B, coupled in parallel to the dual differential in-phase/quadrature-phase output port 210, at the second level of switches in the mixer.

In the mixer, the first level of switches cascade into respective second level of switches between the differential input port 201 and the dual differential I and Q output port 210. For example, the output of switch 611 couples in series to the input of the pair of parallel switches 621A-621B. The output of switch 612 couples in series to the input of the pair of parallel switches 622A-622B. The output of switch 613 couples in series to the input of the pair of parallel switches 623A-623B. The output of switch 614 couples in series to the input of the pair of parallel switches 624A-624B. The output of switch 631 couples in series to the input of the pair of parallel switches 641A-641B. The output of switch 632 couples in series to the input of the pair of parallel switches 642A-642B. The output of switch 633 couples in series to the input of the pair of parallel switches 643A-643B. The output of switch 634 couples in series to the input of the pair of parallel switches 644A-644B.

More particularly, switches 611, 621A are coupled in series between the differential input port (RF-IN) 201 and the in-phase differential output port (BB-I) 210A. Switches 611, 621B are coupled in series between the differential input port (RF-IN) 201 and the quadrature-phase differential output port (BB-Q) 210B.

Switches 612, 622A are coupled in series between the differential input port (RF-IN) 201 and the in-phase differential output port (BB-Ib) 210A. Switches 612, 622B are coupled in series between the differential input port (RF-IN) 201 and the quadrature-phase differential output port (BB-Qb) 210B.

Switches 613, 623A are coupled in series between the differential input port (RF-IN) 201 and the in-phase differential output port (BB-Ib) 210A. Switches 613, 623B are coupled in series between the differential input port (RF-IN) 201 and the quadrature-phase differential output port (BB-Q) 210B.

Switches 614, 624A are coupled in series between the differential input port (RF-IN) 201 and the in-phase differential output port (BB-I) 210A. Switches 614, 624B are coupled in series between the differential input port (RF-IN) 201 and the quadrature-phase differential output port (BB-Qb) 210B.

Furthermore, switches 631, 641A are coupled in series between the differential input port (RF-INb) 201 and the in-phase differential output port (BB-Ib) 210A. Switches 631, 641B are coupled in series between the differential input port (RF-INb) 201 and the quadrature-phase differential output port (BB-Qb) 210B.

Switches 632, 642A are coupled in series between the differential input port (RF-INb) 201 and the in-phase differential output port (BB-I) 210A. Switches 632, 642B are coupled in series between the differential input port (RF-INb) 201 and the quadrature-phase differential output port (BB-Q) 210B.

Switches 633, 643A are coupled in series between the differential input port (RF-INb) 201 and the in-phase differential output port (BB-I) 210A. Switches 633, 643B are coupled in series between the differential input port (RF-INb) 201 and the quadrature-phase differential output port (BB-Qb) 210B.

Switches 634, 644A are coupled in series between the differential input port (RF-INb) 201 and the in-phase differential output port (BB-Ib) 210A. Switches 634, 644B are coupled in series between the differential input port (RF-INb) 201 and the quadrature-phase differential output port (BB-Q) 210B.

Due to the coupling of the switches, the mixer 604 may also be referred to as a cascade switching mixer or a cascade doubled balanced switching mixer. The mixer 604 may be considered a passive mixer as typically power is not directly supplied to the switches.

The switches 611-614, 631-634, 621A-624A, 621B-624B, 641A-644A, and 641B-644B have a respective control input coupled to one of the four phased half duty cycle clock or local oscillating signals LO-I, LO-Ib, LO-Q, and LO-Qb as shown in FIG. 6. The first level of switches 611-614 and 631-634 have one of the LO-I, LO-Ib, LO-Q, or LO-Qb local oscillating signals coupled to their control inputs. The local oscillator signal LO-I is coupled to the control input of switches 611 and 631. The local oscillator signal LO-Ib is coupled to the control input of switches 612 and 632. The local oscillator signal LO-Q is coupled to the control input of switches 613 and 633. The local oscillator signal LO-Qb is coupled to the control input of switches 614 and 634. The second level of switches 621A-624A, 621B-624B, 641A-644A, and 641B-644B also have one of the LO-I, LO-Ib, LO-Q, or LO-Qb local oscillating signals coupled to their control inputs. The local oscillator signal LO-I is coupled to the control input of switches 623B, 624A, 643B, and 644A. The local oscillator signal LO-Ib is coupled to the control input of switches 623A, 624B, 643A, and 644B. The local oscillator signal LO-Q is coupled to the control input of switches 621B, 622A, 641B, and 642A. The local oscillator signal LO-Qb is coupled to the control input of switches 621A, 622B, 641A, and 642B.

The switching activity of the first level switches 611-614, 631-634 and the second level switches 621A-624A, 621B-624B, 641A-644A, and 641B-644B in response to the four phased half duty cycle clock or local oscillating signals LO-I, LO-Ib, LO-Q, and LO-Qb is described with reference to FIGS. 7A-7D and 4A-4D. The switching activity of the switches in the mixer 604 in response to the four phased half duty cycle clocks, convolves/multiplies the differential input signal with the four phased half duty cycle clocks in the time/frequency domain to concurrently generate a differential in-phase (I) signal on the in-phase differential output 210A of the dual differential in-phase/quadrature-phase output port 210 and a differential quadrature-phase (Q) signal on the quadrature-phase differential output 210B of the dual differential in-phase/quadrature-phase output port 210. With the differential in-phase (I) signal and the differential quadrature-phase (Q) signal being concurrently generated by the same mixer 604, less circuit area may used and improvements in the performance of the mixer can be obtained.

The current or voltage load 206 is coupled to the dual differential in-phase/quadrature-phase output port 210 of the mixer 604.

Figure 7A:
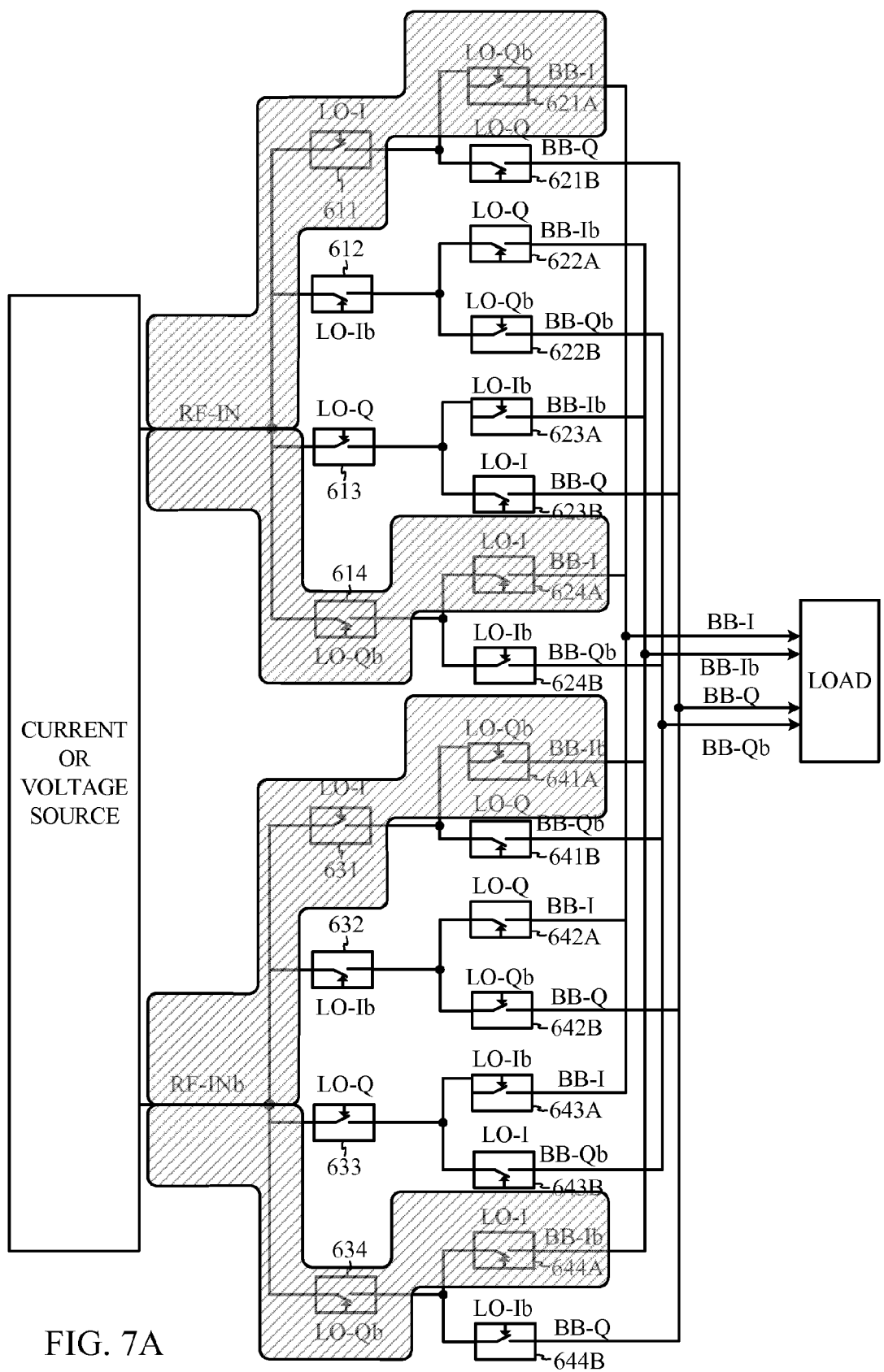
FIGS. 7A-7D illustrate the switching activity of the switches in the mixer shown in FIG. 6 in response to the four phased half duty cycle clocks.

Referring to FIGS. 6, 7A, and 4A, in the first phase 401 with the local oscillating signals LO-I and LO-Qb logically high (e.g., a logical one), switches 611, 621A are both respectively closed such that the positive RF input terminal RF-IN passes through the mixer 604 to the positive in-phase output terminal BB-I which is coupled into the load 206. Switches 614, 624A are also closed such that positive RF input terminal RF-IN passes through the mixer 604 to the positive in-phase output terminal BB-I coupled into the load 206. Switches 631, 641A are also closed such that negative RF input terminal RF-INb passes through the mixer 604 to the negative in-phase output terminal BB-Ib coupled into the load 206. Switches 634, 644A are also closed such that negative RF input terminal RF-INb passes through the mixer 604 to the negative in-phase output terminal BB-Ib coupled into the load 206.

Figure 7B:
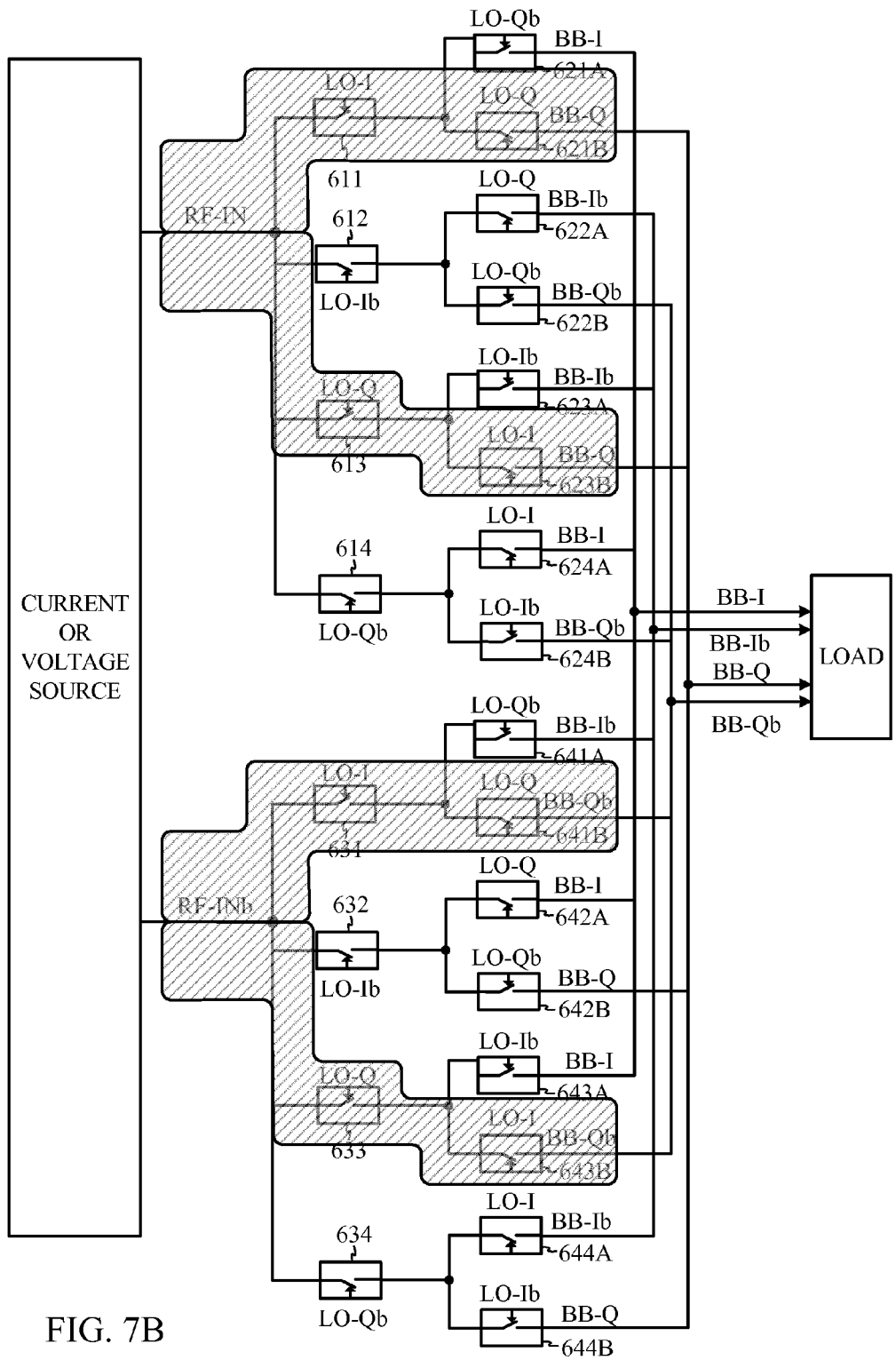

Referring to FIGS. 6, 7B, and 4B, in the second phase 402 with the local oscillating signals LO-I and LO-Q logically high (e.g., a logical one), switches 611, 621B are both closed such that the positive RF input terminal RF-IN passes through the mixer 604 to the positive quadrature-phase output terminal BB-Q coupled into the load 206. Switches 613, 623B are both also closed such that the positive RF input terminal RF-IN passes through the mixer 604 to the positive quadrature-phase output terminal BB-Q coupled into the load 206. Switches 631, 641B are both also closed such that the negative input terminal RF-INb passes through the mixer 604 to the negative quadrature-phase output terminal BB-Qb coupled into the load 206. Switches 633, 643B are both also closed such that the negative input terminal RF-INb passes through the mixer 604 to the negative quadrature-phase output terminal BB-Qb coupled into the load 206.

Figure 7C:
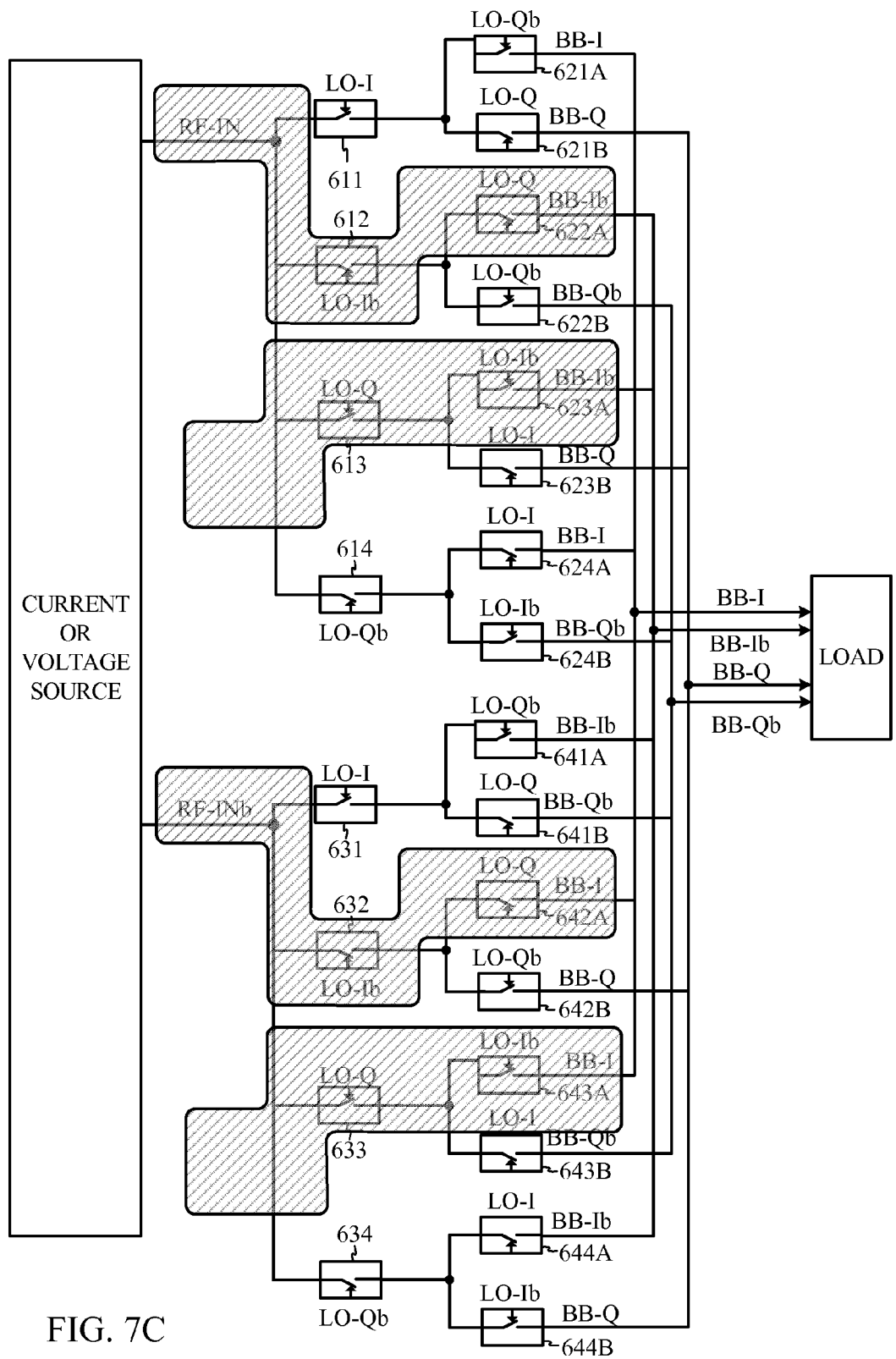

Referring to FIGS. 6, 7C, and 4C, in the third phase 403 with the local oscillating signals LO-Ib and LO-Q logically high (e.g., a logical one), switches 612, 622A are both closed such that the positive RF input terminal RF-IN passes through the mixer 604 to the negative in-phase output terminal BB-Ib coupled into the load 206. Switches 613, 623A are both also closed such that the positive RF input terminal RF-IN passes through the mixer 604 to the negative in-phase output terminal BB-Ib coupled into the load 206. Switches 632, 642A are both also closed such that the negative input terminal RF-INb passes through the mixer 604 to the positive in-phase output terminal BB-I coupled into the load 206. Switches 633, 643A are both also closed such that the negative input terminal RF-INb passes through the mixer 604 to the positive in-phase output terminal BB-I coupled into the load 206.

Figure 7D:
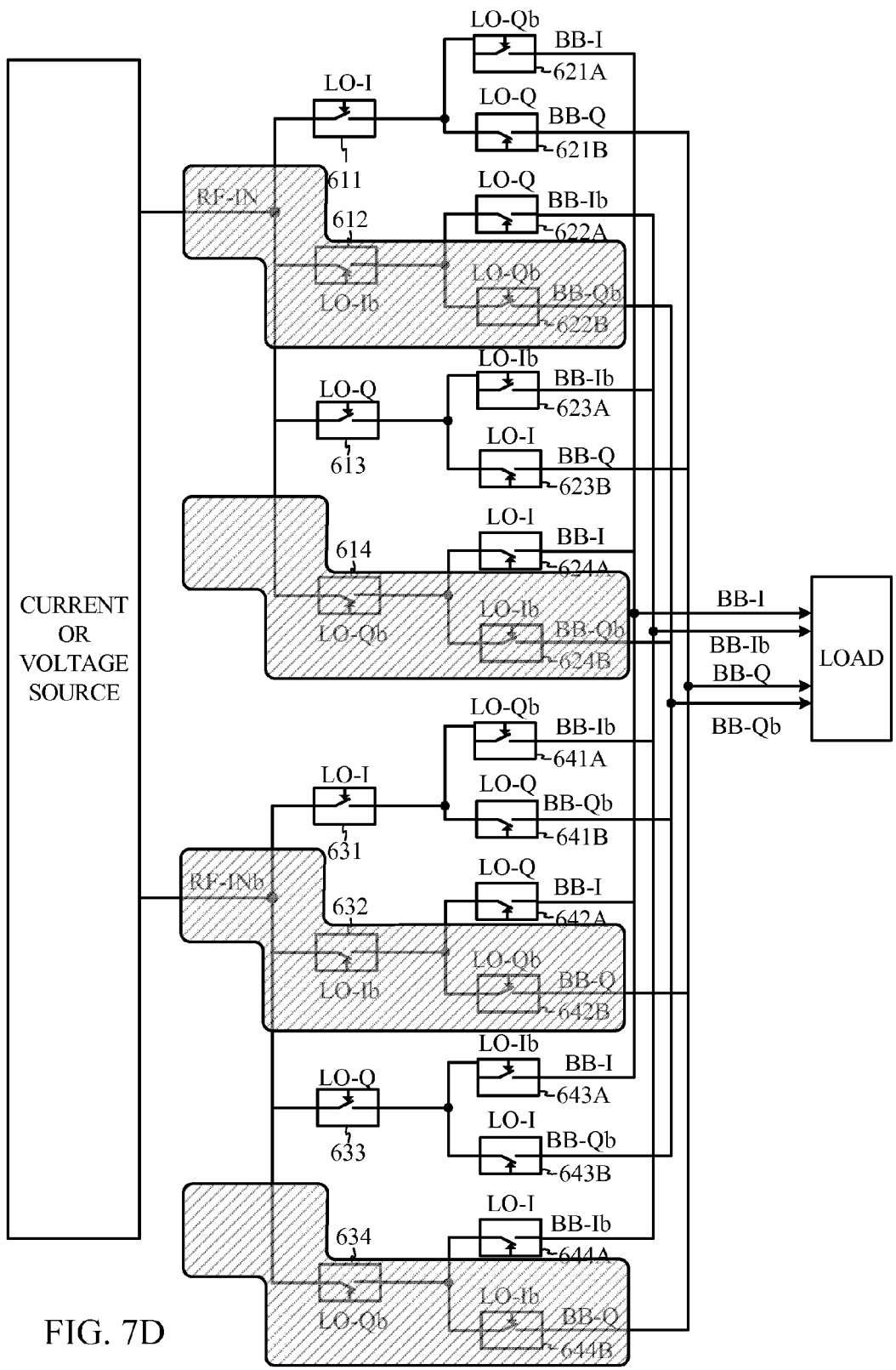

Referring to FIGS. 6, 7D, and 4D, in the fourth phase 404 with the local oscillating signals LO-Ib and LO-Qb logically high (e.g., a logical one), switches 612, 622B are both closed such that the positive RF input terminal RF-IN passes through the mixer 604 to the negative quadrature-phase output terminal BB-Qb coupled into the load 206. Switches 614, 624B are both also closed such that the positive RF input terminal RF-IN passes through the mixer 604 to the negative quadrature-phase output terminal BB-Qb coupled into the load 206. Switches 632, 642B are both also closed such that the negative RF input terminal RF-INb passes through the mixer 604 to the positive quadrature-phase output terminal BB-Q coupled into the load 206. Switches 634, 644B are both also closed such that the negative RF input terminal RF-INb passes through the mixer 604 to the positive quadrature-phase output terminal BB-Q coupled into the load 206.

The four phases of the local oscillating signals are generated over and over again to repeat the switching sequence of the transistors in the mixer 604 and the respective paths through the mixer.

In an aspect, the mixer 600 may be implemented in a mixer system similar to the mixer system 500' of FIG. 5. The mixer system may include a mixer implemented with a number of NFETs along with an ideal current drive, an ideal LO generator, and a dual port load for simulating the mixer 600. The number of NFETs of the mixer may respectively correspond to the switches 611-614, 631-634, 621A-624A, 621B-624B, 641A-644A, and 641B-644B of the mixer 604 described previously with reference to FIG. 6. Moreover, the number of NFETs of the mixer may be coupled together similar to the switches of the mixer 600 to perform the same functions as the mixer 600.

Figure 8:
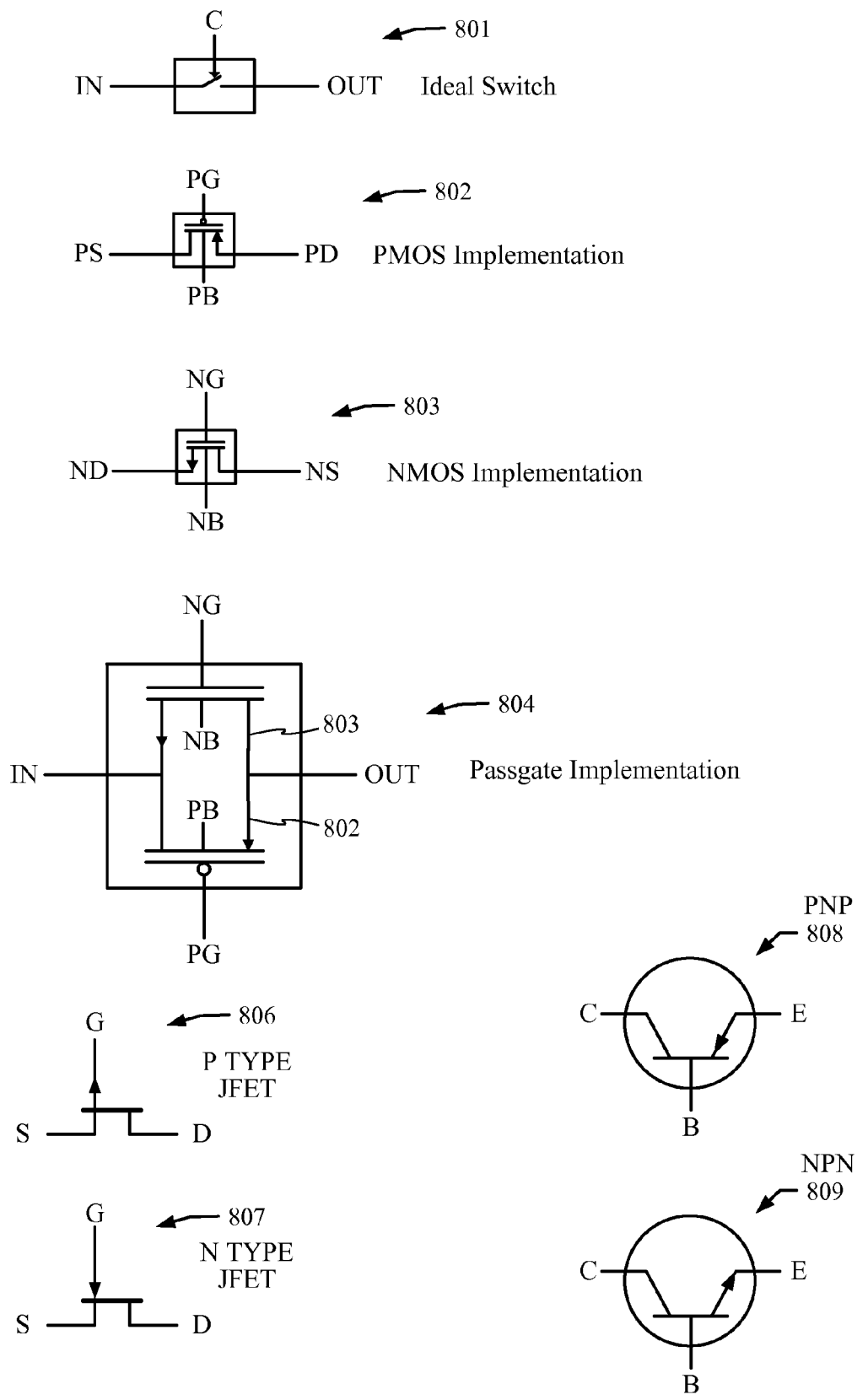
FIG. 8 illustrates different types of switches that may be applied in implementing the quadrature mixers illustrated in FIGS. 2 and 6.

Referring now to FIG. 8, a plurality of switches are illustrated which may be applied in implementing the mixers 204, 604. Each of the switches 211-214, 221A-224A and 221B-224B in the mixer 204 illustrated in FIG. 2 and each of the switches 611-614, 631-634, 621A-624A, 621B-624B, 641A-644A, and 641B-644B illustrated in FIG. 6 are ideal switches. An ideal switch 801 is illustrated in FIG. 8. The ideal switch 801 has a control input terminal C, an input terminal IN, and an output terminal OUT. In the mixers 204, 604, the control input C is coupled to one of the four phased half duty cycle local oscillator or four phased half duty cycle clock signals. The ideal switch is closed coupling the input terminal IN to the output terminal OUT by a positive polarity of a respective one of the four phased half duty cycle clock or local oscillating signals LO-I, LO-Ib, LO-Q, and LO-Qb such as shown in FIGS. 4A-4D.

Instead of ideal switches 801 being used as the switches in the mixer 204 and the mixer 604, different types of transistor switches may be used as the switches in the mixers.

For example, a first group or type of transistor switches may be used that are closed by the application of a high voltage level upon their control terminal and opened by the application of a low voltage level upon their control terminal. The first type of transistor switch includes an n-channel field effect transistor (NFET) 803, an n-type junction field effect transistor (JFET) 807, and an NPN bipolar junction transistor (BJT) 809 that may be used as the switches in the implementation of the mixers 204, 604. Thus, the first type of transistor switch is closed by a positive polarity of a respective one of the four phased half duty cycle clock or local oscillating signals LO-I, LO-Ib, LO-Q, and LO-Qb such as shown in FIGS. 4A-4D to allow current to flow across its poles (e.g., source and drain or collector and emitter) at the appropriate time.

Alternatively, a second group or type of transistor switches may be used that close with the application of a low voltage level upon their control terminals and open with the application of a high voltage level upon their control terminals. The second group or type of transistor switch includes a p-channel field effect transistor (PFET) 802, a p-type junction field effect transistor (JFET) 806, and a PNP bipolar junction transistor (BJT) 808 that may be used as the switches in the implementation of the mixers 204, 604. Thus, the second group or type of transistor switch is closed by a negative polarity of a respective one of the four phased half duty cycle clock or local oscillating signals LO-I, LO-Ib, LO-Q, and LO-Qb to allow current to flow across its poles (e.g., source and drain or collector and emitter). That is, the respective positive polarity of the four phased half duty cycle clock or local oscillating signals LO-I, LO-Ib, LO-Q, and LO-Qb is inverted and coupled to the control terminal (e.g., gate) of the second group or type of transistor switch to close it at the appropriate time.

Alternatively a combination of the first type and the second type of transistor switches may be used in parallel together as the switches in the implementation of the mixers 204, 604 in the form of a fully complementary transfer or pass gate 804, such as a PFET 802 and an NFET 803 with source and drains coupled together in parallel.

The PFET 802 includes a source terminal PS and a drain terminal PD for poles of a switch, a gate terminal PG as the control terminal of the switch, and a body terminal PB. The PFET body terminal PB in an analog transfer gate connection is typically coupled to the PFET source terminal PS.

The NFET 803 includes a source terminal NS and a drain terminal ND for poles of a switch, a gate terminal NG as the control terminal of the switch, and a body terminal NB. The NFET body terminal NB in an analog transfer gate connection is typically coupled to the NFET source terminal NS.

The transfer gate 804 includes an input terminal IN (e.g., PS and NS or PD and ND) and an output terminal OUT (e.g., PD and ND or PS and NS) as poles of a switch, a pair of control terminals (e.g., NG and PG) as control terminals of the switch, and a pair of body terminals (e.g., NB and PB).

The NFET body terminal NB in an analog transfer gate connection is typically coupled to the NFET source terminal NS. The PFET body terminal PB in an analog transfer gate connection is typically coupled to the PFET source terminal PS.

The p-type JFET 806 includes a source terminal S and a drain terminal D for poles and a gate terminal G for the control terminal of the switch. Similarly, the n-type JFET 807 also includes a source terminal S and a drain terminal D for poles and a gate terminal G for the control terminal of the switch.

The PNP bipolar junction transistor (BJT) 808 includes a collector terminal C and an emitter terminal for poles of a switch and a base terminal for the control terminal of the switch. Similarly, the NPN bipolar junction transistor (BJT) 809 includes a collector terminal C and an emitter terminal for poles of a switch and a base terminal for the control terminal of the switch.

While the transistor switches have been described herein as being switched or turned on by various polarities of control signals coupled to the control terminal of the transistor, the level of voltage applied to the control terminals may be set so that the transistors are turned on differently. For example, the NFETs, PFETs, n-type JFETs, and p-type JFETS may be turned on into a saturation (active) region or into a triode (linear or passive) region. Similarly, the bipolar junction transistors may be biased on into a forward-active region of operation.

The voltage levels of the respective control signals (e.g., the four phased half duty cycle clock or local oscillating signals LO-I, LO-Ib, LO-Q, and LO-Qb) coupled to the control terminals of the switches are adjusted accordingly to the type of switches and their desired form of operation.

Figure 9:
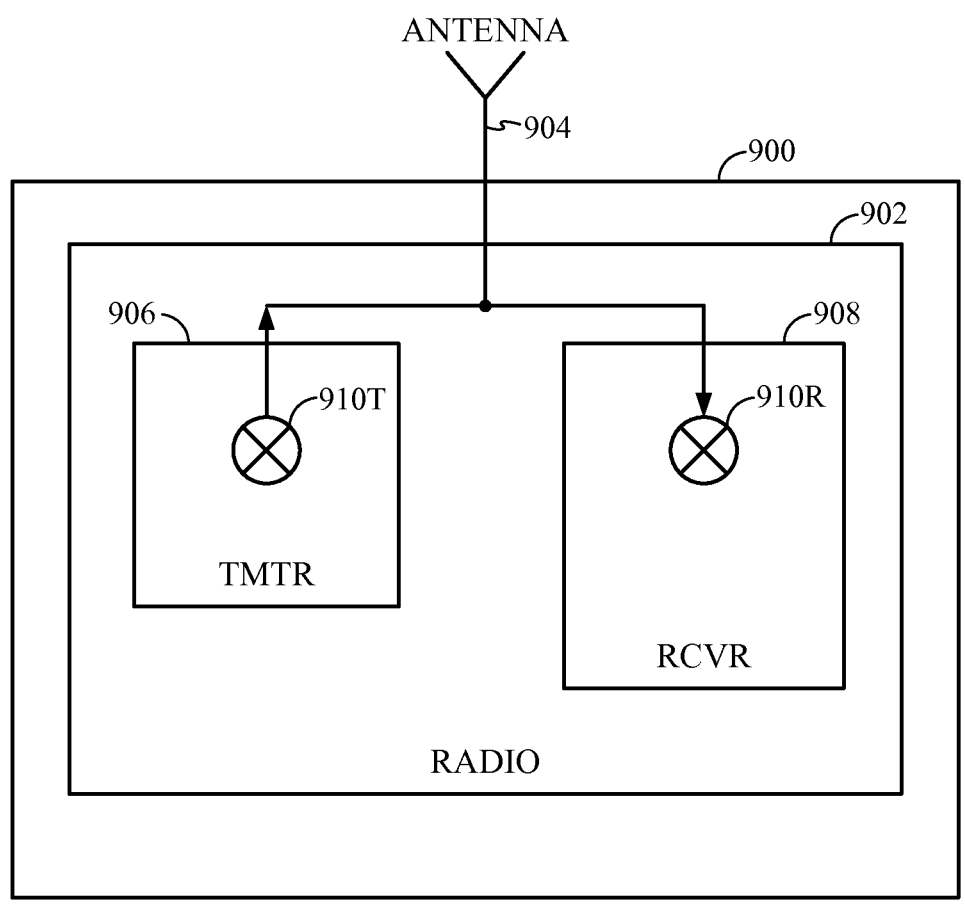
FIG. 9 illustrates a functional block diagram of a simplified radio system in which aspects of the disclosure may be used.

Referring now to FIG. 9, a radio system 900 is illustrated in which the aspects of the inventive RF mixers described herein may be used. The radio system 900 may be a mobile cellular telephone, for example. The radio system 900 includes a radio frequency RF circuit 902 coupled to an antenna 904. The RF circuit 902 may include one or both of an RF transmitter 906 and an RF receiver 908 coupled to the antenna 904.

One or more mixers may be used as an upconverter 910T in the RF transmitter 906. One or more mixers may be used as a downconverter 910R in the RF receiver 908. The quadrature four phase half duty cycle RF mixers described herein may be used as one or more instances of quadrature mixers for the upconverter 910T and/or the downconverter 910R.

Figure 10:
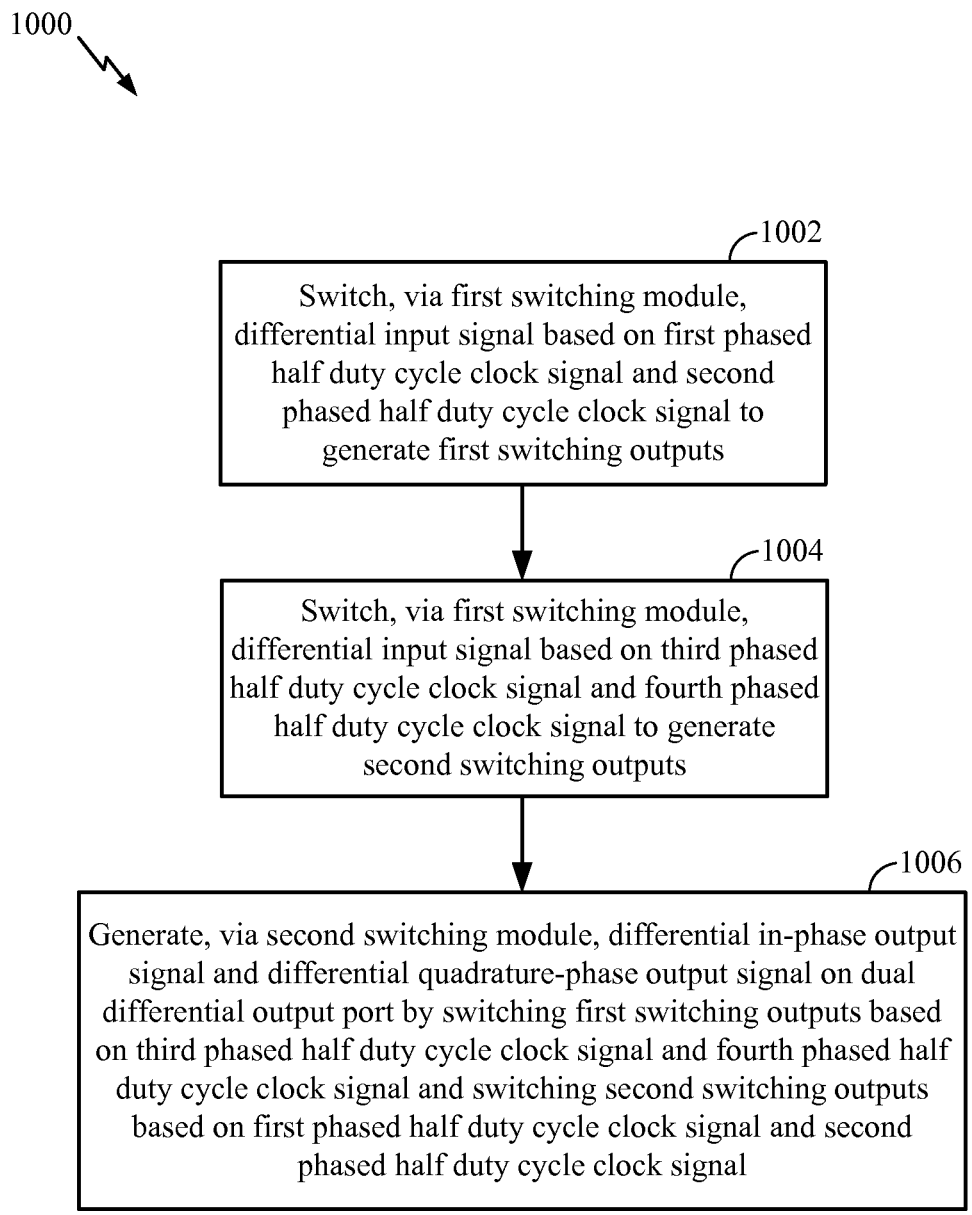
FIG. 10 is a flowchart of an example method of mixing radio frequency signals.

FIG. 10 is a flowchart of an example method 1000 of mixing radio frequency signals. The method 1000 may be performed using an RF mixer (e.g., mixer 204 of FIG. 2 or I-Q mixer 204' of FIG. 5). Although the process 1000 is described below with respect to the elements of the mixer 204 of FIG. 2, other components may be used to implement one or more of the steps described herein.

In an aspect, the RF mixer performs switching of switches based on first, second, third, and fourth phased half duty clock signals (e.g., LO-I, LO-Ib, LO-Q, and LO-Qb) to convolve a differential input signal on a differential input port (e.g., RF-IN, RF-INb) with the first, second, third, and fourth phased half duty cycle clock signals to concurrently generate a differential in-phase output signal (e.g., BB-I, BB-Ib) and a differential quadrature-phase output signal (e.g., BB-Q, BB-Qb) on a dual differential output port. The first, second, third, and fourth phased half duty cycle clock signals are of the same frequency and out of phase by a multiple of ninety degrees with respect to each other.

In an aspect, the differential input signal is a radio frequency differential input signal, the differential in-phase output signal is an intermediate frequency differential in-phase output signal, and the differential quadrature-phase output signal is an intermediate frequency differential quadrature-phase output signal.

In another aspect, the differential input signal is an intermediate frequency differential input signal, the differential in-phase output signal is a radio frequency differential in-phase output signal, and the differential quadrature-phase output signal is a radio frequency differential quadrature-phase output signal.

Referring to FIG. 10, at block 1002, the RF mixer switches, via a first switching module (e.g., via switches 211, 212), the differential input signal based on the first phased half duty cycle clock signal (e.g., LO-I) and the second phased half duty cycle clock signal (e.g., LO-Ib) to generate first switching outputs.

At block 1004, the RF mixer switches, via the first switching module (e.g., via switches 213, 214), the differential input signal based on the third phased half duty cycle clock signal (e.g., LO-Q) and the fourth phased half duty cycle clock signal (LO-Qb) to generate second switching outputs.

At block 1006, the RF mixer generates, via a second switching module, the differential in-phase output signal (e.g., BB-I, BB-Ib) and the differential quadrature-phase output signal (e.g., BB-Q, BB-Qb) on the dual differential output port. For example, the second switching module generates the output signals by switching (e.g., via switch pair 221A, 221B and switch pair 222A, 222B) the first switching outputs based on the third phased half duty cycle clock signal (e.g., LO-Q) and the fourth phased half duty cycle clock signal (e.g., LO-Qb) and switching (e.g., via switch pair 223A, 223B and switch pair 224A and 224B) the second switching outputs based on the first phased half duty cycle clock signal (e.g., LO-I) and the second phased half duty cycle clock signal (e.g., LO-Ib).

In an aspect, the first switching module includes a plurality of first switches including first control inputs, wherein a first subset of first switches (e.g., switches 211, 212) are coupled in parallel to a positive input (RF-IN) of the differential input port and a second subset of first switches (e.g., switches 213, 214) are coupled in parallel to a negative input (RF-INb) of the differential input port. The second switching module includes a plurality of parallel second switch pairs including second control inputs, wherein each pair of parallel second switches (e.g., switch pair 221A, 221B and switch pair 222A, 222B) of a first subset of second switch pairs is coupled in series to one respective first switch of the first subset of first switches (e.g., switch 211 or switch 212) and to the dual differential output port (e.g., output port 210). Moreover, each pair of parallel second switches (e.g., switch pair 223A, 223B and switch pair 224A and 224B) of a second subset of second switch pairs is coupled in series to one respective first switch of the second subset of first switches (e.g., switch 213 or switch 214) and to the dual differential output port.

In an aspect, the first control inputs of the first subset of first switches are configured to receive the first phased half duty cycle clock signal and the second phased half duty cycle clock signal to facilitate switching at the first subset of first switches, and the second control inputs of the first subset of second switch pairs are configured to receive the third phased half duty cycle clock signal and the fourth phased half duty cycle clock signal to facilitate switching at the first subset of second switch pairs. Furthermore, the first control inputs of the second subset of first switches are configured to receive the third phased half duty cycle clock signal and the fourth phased half duty cycle clock signal to facilitate switching at the second subset of first switches, and the second control inputs of the second subset of second switch pairs are configured to receive the first phased half duty cycle clock signal and the second phased half duty cycle clock signal to facilitate switching at the second subset of second switch pairs. The switching at the first subset of first switches, the switching at the first subset of second switch pairs, the switching at the second subset of first switches, and the switching at the second subset of second switch pairs convolves the differential input signal on the differential input port with the first, second, third, and fourth phased half duty cycle clock signals to concurrently generate the differential in-phase output signal and the differential quadrature-phase output signal on the dual differential output port.

In an aspect, the plurality of first switches and the second switches of the plurality of parallel second switch pairs may be at least one of a first type of transistor, a second type of transistor, or a combination of the first type of transistor and the second type of transistor. The first type of transistor may be closed by an application of a high voltage level and opened by an application of a low voltage level. The second type of transistor may be closed by an application of a low voltage level and opened by an application of a high voltage level.

Moreover, means for switching switches based on first, second, third, and fourth phased half duty clock signals (e.g., LO-I, LO-Ib, LO-Q, and LO-Qb) to convolve a differential input signal on a differential input port (e.g., RF-IN, RF-INb) with the first, second, third, and fourth phased half duty cycle clock signals to concurrently generate a differential in-phase output signal (e.g., BB-I, BB-Ib) and a differential quadrature-phase output signal (e.g., BB-Q, BB-Qb) on a dual differential output port (e.g., output port 210) may comprise the RF mixer 204 and the various switches implemented within the RF mixer 204, the current or voltage source 202, and/or the clock generator 208. Means for switching the differential input signal based on the first phased half duty cycle clock signal (e.g., LO-I) and the second phased half duty cycle clock signal (e.g., LO-Ib) to generate first switching outputs may comprise switches 211, 212, the current or voltage source 202, and/or the clock generator 208. Means for switching the differential input signal based on the third phased half duty cycle clock signal (e.g., LO-Q) and the fourth phased half duty cycle clock signal (LO-Qb) to generate second switching outputs may comprise switches 213, 214, the current or voltage source 202, and/or the clock generator 208. Means for generating the differential in-phase output signal and the differential quadrature-phase output signal on the dual differential output port by switching the first switching outputs based on the third phased half duty cycle clock signal (e.g., LO-Q) and the fourth phased half duty cycle clock signal (e.g., LO-Qb) may comprise switch pair 221A, 221B, switch pair 222A, 222B, the current or voltage source 202, and/or the clock generator 208. Means for generating the differential in-phase output signal and the differential quadrature-phase output signal on the dual differential output port by switching the second switching outputs based on the first phased half duty cycle clock signal (e.g., LO-I) and the second phased half duty cycle clock signal (e.g., LO-Ib) may comprise switch pair 223A, 223B, switch pair 224A and 224B, the current or voltage source 202, and/or the clock generator 208.

Figure 11:
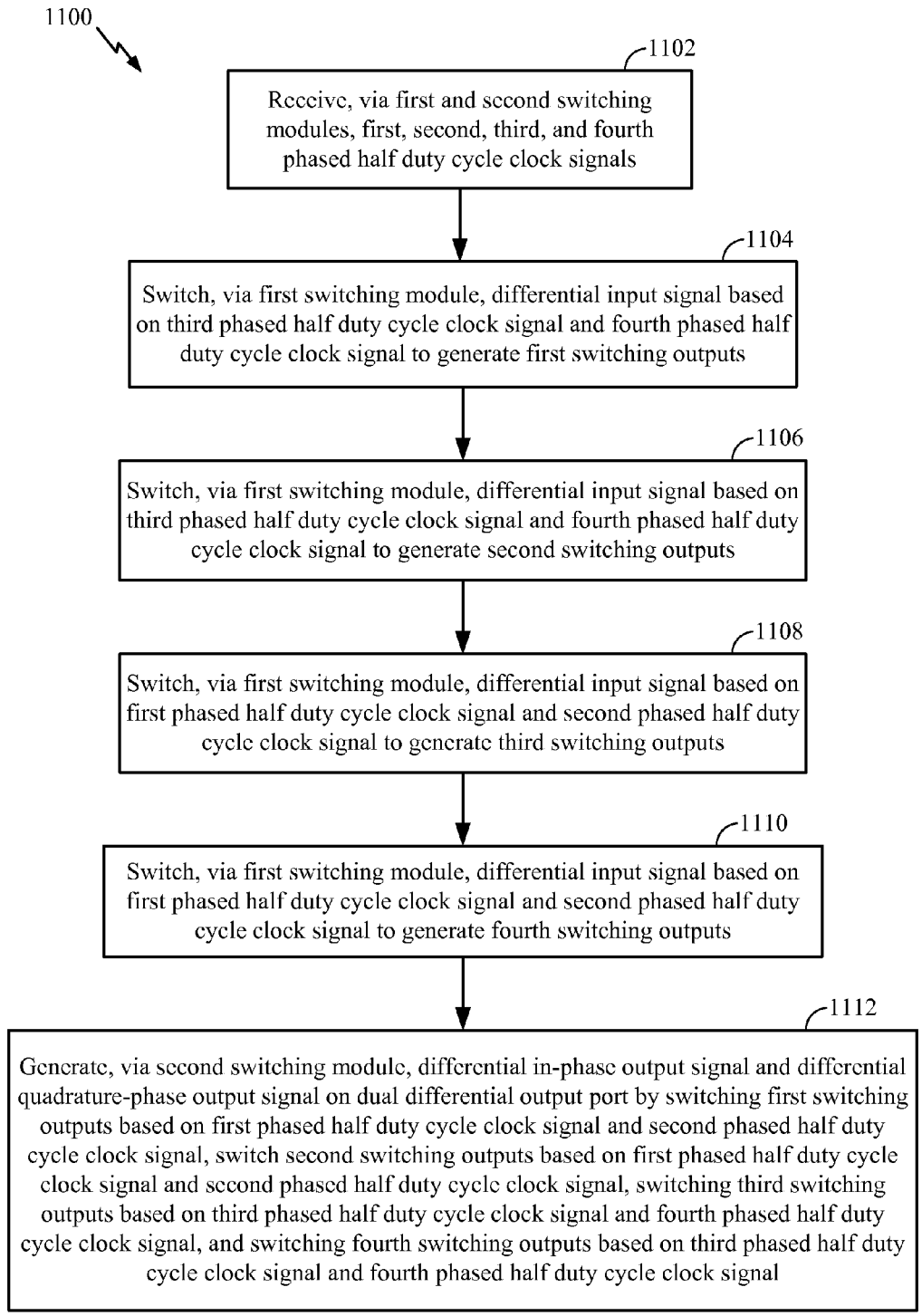
FIG. 11 is a flowchart of another example method of mixing radio frequency signals.

FIG. 11 is a flowchart of an example method 1100 of mixing radio frequency signals. The method 1100 may be performed using an RF mixer (e.g., mixer 604 of FIG. 6). Although the process 1100 is described below with respect to the elements of the mixer 604 of FIG. 6, other components may be used to implement one or more of the steps described herein.

In an aspect, the RF mixer performs switching of switches based on first, second, third, and fourth phased half duty clock signals (e.g., LO-I, LO-Ib, LO-Q, and LO-Qb) to convolve a differential input signal on a differential input port (e.g., RF-IN, RF-INb) with the first, second, third, and fourth phased half duty cycle clock signals to concurrently generate a differential in-phase output signal (BB-I, BB-Ib) and a differential quadrature-phase output signal (BB-Q, BB-Qb) on a dual differential output port (e.g., output port 210). The first, second, third, and fourth phased half duty cycle clock signals are of the same frequency and out of phase by a multiple of ninety degrees with respect to each other.

In an aspect, the differential input signal is a radio frequency differential input signal, the differential in-phase output signal is an intermediate frequency differential in-phase output signal, and the differential quadrature-phase output signal is an intermediate frequency differential quadrature-phase output signal.

In another aspect, the differential input signal is an intermediate frequency differential input signal, the differential in-phase output signal is a radio frequency differential in-phase output signal, and the differential quadrature-phase output signal is a radio frequency differential quadrature-phase output signal.

Referring to FIG. 11, at block 1102, the RF mixer receives, via first and second switching modules, the first, second, third, and fourth phased half duty cycle clock signals. At block 1104, the RF mixer switches, via the first switching module (e.g., via switches 613, 614), the differential input signal based on the third phased half duty cycle clock signal (LO-Q) and the fourth phased half duty cycle clock signal (LO-Qb) to generate first switching outputs.

At block 1106, the RF mixer switches, via the first switching module (e.g., via switches 633, 634), the differential input signal based on the third phased half duty cycle clock signal (LO-Q) and the fourth phased half duty cycle clock signal (LO-Qb) to generate second switching outputs.

At block 1108, the RF mixer switches, via the first switching module (e.g., via switches 611, 612), the differential input signal based on the first phased half duty cycle clock signal (LO-I) and the second phased half duty cycle clock signal (LO-Ib) to generate third switching outputs.

At block 1110, the RF mixer switches, via the first switching module (e.g., via switches 631, 632), the differential input signal based on the first phased half duty cycle clock signal (LO-I) and the second phased half duty cycle clock signal (LO-Ib) to generate fourth switching outputs.

At block 1112, the RF mixer generates, via the second switching module, the differential in-phase output signal (BB-I, BB-Ib) and the differential quadrature-phase output signal (BB-Q, BB-Qb) on the dual differential output port by switching the first switching outputs based on the first phased half duty cycle clock signal and the second phased half duty cycle clock signal, switching the second switching outputs based on the first phased half duty cycle clock signal and the second phased half duty cycle clock signal, switching the third switching outputs based on the third phased half duty cycle clock signal and the fourth phased half duty cycle clock signal, and switching the fourth switching outputs based on the third phased half duty cycle clock signal and the fourth phased half duty cycle clock signal.

In an aspect, the first switching module includes a plurality of first switches including first control inputs, wherein a first subset of first switches (e.g., switches 613, 614) are coupled in parallel to a positive input (RF-IN) of the differential input port, a second subset of first switches (e.g., switches 633, 634) are coupled in parallel to a negative input (RF-INb) of the differential input port, a third subset of first switches (e.g., switches 611, 612) are coupled in parallel to the positive input (RF-IN) of the differential input port, and a fourth subset of first switches (e.g., switches 631, 632) are coupled in parallel to the negative input (RF-INb) of the differential input port.

The second switching module includes a plurality of parallel second switch pairs including second control inputs. Each pair of parallel second switches of a first subset of second switch pairs (e.g., switch pair 623A, 623B and switch pair 624A, 624B) is coupled in series to one respective first switch of the first subset of first switches (e.g., switch 613 or switch 614) and to the dual differential output port.

Each pair of parallel second switches of a second subset of second switch pairs (e.g., switch pair 643A, 643B and switch pair 644A, 644B) is coupled in series to one respective first switch of the second subset of first switches (e.g., switch 633 or switch 634) and to the dual differential output port.

Each pair of parallel second switches of a third subset of second switch pairs (e.g., switch pair 621A, 621B and switch pair 622A, 622B) is coupled in series to one respective first switch of the third subset of first switches (e.g., switch 611 or switch 612) and to the dual differential output port.

Each pair of parallel second switches of a fourth subset of second switch pairs (e.g., switch pair 641A, 641B and switch pair 642A, 642B) is coupled in series to one respective first switch of the fourth subset of first switches (e.g., switch 631 or switch 632) and to the dual differential output port.

In an aspect, the first control inputs of the third subset of first switches are configured to receive the first phased half duty cycle clock signal and the second phased half duty cycle clock signal to facilitate switching at the third subset of first switches, and the second control inputs of the third subset of second switch pairs are configured to receive the third phased half duty cycle clock signal and the fourth phased half duty cycle clock signal to facilitate switching at the third subset of second switch pairs. Moreover, the first control inputs of the fourth subset of first switches are configured to receive the first phased half duty cycle clock signal and the second phased half duty cycle clock signal to facilitate switching at the fourth subset of first switches, and the second control inputs of the fourth subset of second switch pairs are configured to receive the third phased half duty cycle clock signal and the fourth phased half duty cycle clock signal to facilitate switching at the fourth subset of second switch pairs. Furthermore, the first control inputs of the first subset of first switches are configured to receive the third phased half duty cycle clock signal and the fourth phased half duty cycle clock signal to facilitate switching at the first subset of first switches, and the second control inputs of the first subset of second switch pairs are configured to receive the first phased half duty cycle clock signal and the second phased half duty cycle clock signal to facilitate switching at the first subset of second switch pairs.

Also, the first control inputs of the second subset of first switches are configured to receive the third phased half duty cycle clock signal and the fourth phased half duty cycle clock signal to facilitate switching at the second subset of first switches, and the second control inputs of the second subset of second switch pairs are configured to receive the first phased half duty cycle clock signal and the second phased half duty cycle clock signal to facilitate switching at the second subset of second switch pairs. The switching at the first subset of first switches, the switching at the first subset of second switch pairs, the switching at the second subset of first switches, the switching at the second subset of second switch pairs, the switching at the third subset of first switches, the switching at the third subset of second switch pairs, the switching at the fourth subset of first switches, and the switching at the fourth subset of second switch pairs convolves the differential input signal on the differential input port with the first, second, third, and fourth phased half duty cycle clock signals to concurrently generate the differential in-phase output signal and the differential quadrature-phase output signal on the dual differential output port In an aspect, the plurality of first switches and the second switches of the plurality of parallel second switch pairs may be at least one of a first type of transistor, a second type of transistor, or a combination of the first type of transistor and the second type of transistor. The first type of transistor may be closed by an application of a high voltage level and opened by an application of a low voltage level. The second type of transistor may be closed by an application of a low voltage level and opened by an application of a high voltage level.

Moreover, means for receiving first, second, third, and fourth phased half duty cycle clock signals and switching switches based on the received first, second, third, and fourth phased half duty clock signals (e.g., LO-I, LO-Ib, LO-Q, and LO-Qb) to convolve a differential input signal on a differential input port (e.g., RF-IN, RF-INb) with the first, second, third, and fourth phased half duty cycle clock signals to concurrently generate a differential in-phase output signal (BB-I, BB-Ib) and a differential quadrature-phase output signal (BB-Q, BB-Qb) on a dual differential output port (e.g., output port 210) may comprise the RF mixer 604 and the various switches implemented within the RF mixer 604, the current or voltage source 202, and/or the clock generator 208. Means for switching the differential input signal based on the third phased half duty cycle clock signal (LO-Q) and the fourth phased half duty cycle clock signal (LO-Qb) to generate first switching outputs may comprise switches 613, 614, the current or voltage source 202, and/or the clock generator 208. Means for switching the differential input signal based on the third phased half duty cycle clock signal (LO-Q) and the fourth phased half duty cycle clock signal (LO-Qb) to generate second switching outputs may comprise switches 633, 634, the current or voltage source 202, and/or the clock generator 208. Means for switching the differential input signal based on the first phased half duty cycle clock signal (LO-I) and the second phased half duty cycle clock signal (LO-Ib) to generate third switching outputs may comprise switches 611, 612, the current or voltage source 202, and/or the clock generator 208. Means for switching the differential input signal based on the first phased half duty cycle clock signal (LO-I) and the second phased half duty cycle clock signal (LO-Ib) to generate fourth switching outputs may comprise switches 631, 632, the current or voltage source 202, and/or the clock generator 208.

Means for generating the differential in-phase output signal and a differential quadrature-phase output signal on the dual differential output port by switching the first switching outputs based on the first phased half duty cycle clock signal (LO-I) and the second phased half duty cycle clock signal (LO-Ib) may comprise switch pair 623A, 623, switch pair 624A, 624B, the current or voltage source 202, and/or the clock generator 208. Means for generating the differential in-phase output signal and a differential quadrature-phase output signal on the dual differential output port by switching the second switching outputs based on the first phased half duty cycle clock signal (LO-I) and the second phased half duty cycle clock signal (LO-Ib) may comprise switch pair 643A, 643B, switch pair 644A, 644B, the current or voltage source 202, and/or the clock generator 208. Means for generating the differential in-phase output signal and a differential quadrature-phase output signal on the dual differential output port by switching the third switching outputs based on the third phased half duty cycle clock signal (LO-Q) and the fourth phased half duty cycle clock signal (LO-Qb) may comprise switch pair 621A, 621B, switch pair 622A, 622B), the current or voltage source 202, and/or the clock generator 208. Means for generating the differential in-phase output signal and a differential quadrature-phase output signal on the dual differential output port by switching the fourth switching outputs based on the third phased half duty cycle clock signal (LO-Q) and the fourth phased half duty cycle clock signal (LO-Qb) may comprise switch pair 641A, 641B, switch pair 642A, 642B, the current or voltage source 202, and/or the clock generator 208.

While certain exemplary aspects have been described and shown in the accompanying drawings, it is to be understood that such aspects are merely illustrative of and not restrictive on the broad disclosure, and that the aspects of the disclosure not be limited to the specific constructions and arrangements shown and described, since various other modifications may occur to those ordinarily skilled in the art. Instead, the aspects of the disclosure should be construed according to the claims that follow below.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. A radio frequency mixer, comprising:
a first switching module configured to:
switch a differential input signal based on a first phased half duty cycle clock signal and a second phased half duty cycle clock signal to generate first switching outputs, and
switch the differential input signal based on a third phased half duty cycle clock signal and a fourth phased half duty cycle clock signal to generate second switching outputs; and
a second switching module configured to generate a differential in-phase output signal and a differential quadrature-phase output signal on a dual differential output port by being configured to:
switch the first switching outputs based on the third phased half duty cycle clock signal and the fourth phased half duty cycle clock signal, and
switch the second switching outputs based on the first phased half duty cycle clock signal and the second phased half duty cycle clock signal.

2. The radio frequency mixer of claim 1, wherein the first, second, third, and fourth phased half duty cycle clock signals are of the same frequency and out of phase by a multiple of ninety degrees with respect to each other.

3. The radio frequency mixer of claim 1, wherein:
the differential input signal is a radio frequency differential input signal;
the differential in-phase output signal is an intermediate frequency differential in-phase output signal; and
the differential quadrature-phase output signal is an intermediate frequency differential quadrature-phase output signal.

4. The radio frequency mixer of claim 1, wherein:
the differential input signal is an intermediate frequency differential input signal;
the differential in-phase output signal is a radio frequency differential in-phase output signal; and
the differential quadrature-phase output signal is a radio frequency differential quadrature-phase output signal.

5. The radio frequency mixer of claim 1,
wherein the first switching module comprises a plurality of first switches comprising first control inputs, wherein a first subset of first switches of the plurality of first switches are coupled in parallel to a positive input of a differential input port and a second subset of first switches of the plurality of first switches are coupled in parallel to a negative input of the differential input port, and
wherein the second switching module comprises a plurality of parallel second switch pairs comprising second control inputs, wherein each pair of parallel second switches of a first subset of second switch pairs of the plurality of parallel second switch pairs is coupled in series to one respective first switch of the first subset of first switches and to the dual differential output port, and wherein each pair of parallel second switches of a second subset of second switch pairs of the plurality of parallel second switch pairs is coupled in series to one respective first switch of the second subset of first switches and to the dual differential output port.

6. The radio frequency mixer of claim 5,
wherein the first control inputs of the first subset of first switches are configured to receive the first phased half duty cycle clock signal and the second phased half duty cycle clock signal to facilitate switching at the first subset of first switches, and wherein the second control inputs of the first subset of second switch pairs are configured to receive the third phased half duty cycle clock signal and the fourth phased half duty cycle clock signal to facilitate switching at the first subset of second switch pairs,
wherein the first control inputs of the second subset of first switches are configured to receive the third phased half duty cycle clock signal and the fourth phased half duty cycle clock signal to facilitate switching at the second subset of first switches, and wherein the second control inputs of the second subset of second switch pairs are configured to receive the first phased half duty cycle clock signal and the second phased half duty cycle clock signal to facilitate switching at the second subset of second switch pairs, and
wherein the switching at the first subset of first switches, the switching at the first subset of second switch pairs, the switching at the second subset of first switches, and the switching at the second subset of second switch pairs convolves the differential input signal on the differential input port with the first, second, third, and fourth phased half duty cycle clock signals to concurrently generate the differential in-phase output signal and the differential quadrature-phase output signal on the dual differential output port.

7. The radio frequency mixer of claim 5, wherein the plurality of first switches and the second switches of the plurality of parallel second switch pairs comprise:
a first type of transistor;
a second type of transistor; or
a combination of the first type of transistor and the second type of transistor,
wherein the first type of transistor is closed by an application of a high voltage level and opened by an application of a low voltage level, and
wherein the second type of transistor is closed by an application of a low voltage level and opened by an application of a high voltage level.

8. A method of mixing radio frequency signals, comprising:
switching, via a first switching module, a differential input signal based on a first phased half duty cycle clock signal and a second phased half duty cycle clock signal to generate first switching outputs;
switching, via the first switching module, the differential input signal based on a third phased half duty cycle clock signal and a fourth phased half duty cycle clock signal to generate second switching outputs; and
generating, via a second switching module, a differential in-phase output signal and a differential quadrature-phase output signal on a dual differential output port by switching the first switching outputs based on the third phased half duty cycle clock signal and the fourth phased half duty cycle clock signal and switching the second switching outputs based on the first phased half duty cycle clock signal and the second phased half duty cycle clock signal.

9. The method of claim 8, wherein the first, second, third, and fourth phased half duty cycle clock signals are of the same frequency and out of phase by a multiple of ninety degrees with respect to each other.

10. The method of claim 8, wherein:
the differential input signal is a radio frequency differential input signal;

the differential in-phase output signal is an intermediate frequency differential in-phase output signal; and the differential quadrature-phase output signal is an intermediate frequency differential quadrature-phase output signal.

11. The method of claim 8, wherein:

the differential input signal is an intermediate frequency differential input signal;

the differential in-phase output signal is a radio frequency differential in-phase output signal; and the differential quadrature-phase output signal is a radio frequency differential quadrature-phase output signal.

12. The method of claim 8, wherein the first switching module comprises a plurality of first switches comprising first control inputs, wherein a first subset of first switches of the plurality of first switches are coupled in parallel to a positive input of a differential input port and a second subset of first switches of the plurality of first switches are coupled in parallel to a negative input of the differential input port, and wherein the second switching module comprises a plurality of parallel second switch pairs comprising second control inputs, wherein each pair of parallel second switches of a first subset of second switch pairs of the plurality of parallel second switch pairs is coupled in series to one respective first switch of the first subset of first switches and to the dual differential output port, and wherein each pair of parallel second switches of a second subset of second switch pairs of the plurality of parallel second switch pairs is coupled in series to one respective first switch of the second subset of first switches and to the dual differential output port.

13. The method of claim 12, wherein the first control inputs of the first subset of first switches are configured to receive the first phased half duty cycle clock signal and the second phased half duty cycle clock signal to facilitate switching at the first subset of first switches, and wherein the second control inputs of the first subset of second switch pairs are configured to receive the third phased half duty cycle clock signal and the fourth phased half duty cycle clock signal to facilitate switching at the first subset of second switch pairs, wherein the first control inputs of the second subset of first switches are configured to receive the third phased half duty cycle clock signal and the fourth phased half duty cycle clock signal to facilitate switching at the second subset of first switches, and wherein the second control inputs of the second subset of second switch pairs are configured to receive the first phased half duty cycle clock signal and the second phased half duty cycle clock signal to facilitate switching at the second subset of second switch pairs, and wherein the switching at the first subset of first switches, the switching at the first subset of second switch pairs, the switching at the second subset of first switches, and the switching at the second subset of second switch pairs convolves the differential input signal on the differential input port with the first, second, third, and fourth phased half duty cycle clock signals to concurrently generate the differential in-phase output signal and the differential quadrature-phase output signal on the dual differential output port.

14. The method of claim 12, wherein the plurality of first switches and the second switches of the plurality of parallel second switch pairs comprise:

a first type of transistor;

a second type of transistor; or a combination of the first type of transistor and the second type of transistor, wherein the first type of transistor is closed by an application of a high voltage level and opened by an application of a low voltage level, and wherein the second type of transistor is closed by an application of a low voltage level and opened by an application of a high voltage level.

15. A radio frequency mixer, comprising:

a first switching module configured to receive first, second, third, and fourth phased half duty cycle clock signals, wherein the first switching module is configured to:

switch a differential input signal based on the third phased half duty cycle clock signal and the fourth phased half duty cycle clock signal to generate first switching outputs, switch the differential input signal based on the third phased half duty cycle clock signal and the fourth phased half duty cycle clock signal to generate second switching outputs, switch the differential input signal based on the first phased half duty cycle clock signal and the second phased half duty cycle clock signal to generate third switching outputs, and switch the differential input signal based on the first phased half duty cycle clock signal and the second phased half duty cycle clock signal to generate fourth switching outputs; and a second switching module configured to receive the first second, third, and fourth phased half duty cycle clock signals, wherein the second switching module is configured to generate a differential in-phase output signal and a differential quadrature-phase output signal on a dual differential output port by being configured to:

switch the first switching outputs based on the first phased half duty cycle clock signal and the second phased half duty cycle clock signal, switch the second switching outputs based on the first phased half duty cycle clock signal and the second phased half duty cycle clock signal, switch the third switching outputs based on the third phased half duty cycle clock signal and the fourth phased half duty cycle clock signal, and switch the fourth switching outputs based on the third phased half duty cycle clock signal and the fourth phased half duty cycle clock signal.

16. The radio frequency mixer of claim 15, wherein the first, second, third, and fourth phased half duty cycle clock signals are of the same frequency and out of phase by a multiple of ninety degrees with respect to each other.

17. The radio frequency mixer of claim 15, wherein:

the differential input signal is a radio frequency differential input signal;

the differential in-phase output signal is an intermediate frequency differential in-phase output signal; and the differential quadrature-phase output signal is an intermediate frequency differential quadrature-phase output signal.

18. The radio frequency mixer of claim 15, wherein:

the differential input signal is an intermediate frequency differential input signal;

the differential in-phase output signal is a radio frequency differential in-phase output signal; and the differential quadrature-phase output signal is a radio frequency differential quadrature-phase output signal.

19. The radio frequency mixer of claim 15,
wherein the first switching module comprises a plurality of first switches comprising first control inputs, wherein a first subset of first switches of the plurality of first switches are coupled in parallel to a positive input of a differential input port, a second subset of first switches of the plurality of first switches are coupled in parallel to a negative input of the differential input port, a third subset of first switches of the plurality of first switches are coupled in parallel to the positive input of the differential input port, and a fourth subset of first switches of the plurality of first switches are coupled in parallel to the negative input of the differential input port, and
wherein the second switching module comprises a plurality of parallel second switch pairs comprising second control inputs, wherein each pair of parallel second switches of a first subset of second switch pairs of the plurality of parallel second switch pairs is coupled in series to one respective first switch of the first subset of first switches and to the dual differential output port, wherein each pair of parallel second switches of a second subset of second switch pairs of the plurality of parallel second switch pairs is coupled in series to one respective first switch of the second subset of first switches and to the dual differential output port, wherein each pair of parallel second switches of a third subset of second switch pairs of the plurality of parallel second switch pairs is coupled in series to one respective first switch of the third subset of first switches and to the dual differential output port, and wherein each pair of parallel second switches of a fourth subset of second switch pairs of the plurality of parallel second switch pairs is coupled in series to one respective first switch of the fourth subset of first switches and to the dual differential output port.

20. The radio frequency mixer of claim 19,
wherein the first control inputs of the third subset of first switches are configured to receive the first phased half duty cycle clock signal and the second phased half duty cycle clock signal to facilitate switching at the third subset of first switches, and wherein the second control inputs of the third subset of second switch pairs are configured to receive the third phased half duty cycle clock signal and the fourth phased half duty cycle clock signal to facilitate switching at the third subset of second switch pairs,
wherein the first control inputs of the fourth subset of first switches are configured to receive the first phased half duty cycle clock signal and the second phased half duty cycle clock signal to facilitate switching at the fourth subset of first switches, and wherein the second control inputs of the fourth subset of second switch pairs are configured to receive the third phased half duty cycle clock signal and the fourth phased half duty cycle clock signal to facilitate switching at the fourth subset of second switch pairs,
wherein the first control inputs of the first subset of first switches are configured to receive the third phased half duty cycle clock signal and the fourth phased half duty cycle clock signal to facilitate switching at the first subset of first switches, and wherein the second control inputs of the first subset of second switch pairs are configured to receive the first phased half duty cycle clock signal and the second phased half duty cycle clock signal to facilitate switching at the first subset of second switch pairs,
wherein the first control inputs of the second subset of first switches are configured to receive the third phased half duty cycle clock signal and the fourth phased half duty cycle clock signal to facilitate switching at the second subset of first switches, and wherein the second control inputs of the second subset of second switch pairs are configured to receive the first phased half duty cycle clock signal and the second phased half duty cycle clock signal to facilitate switching at the second subset of second switch pairs, and
wherein the switching at the first subset of first switches, the switching at the first subset of second switch pairs, the switching at the second subset of first switches, the switching at the second subset of second switch pairs, the switching at the third subset of first switches, the switching at the third subset of second switch pairs, the switching at the fourth subset of first switches, and the switching at the fourth subset of second switch pairs convolves the differential input signal on the differential input port with the first, second, third, and fourth phased half duty cycle clock signals to concurrently generate the differential in-phase output signal and the differential quadrature-phase output signal on the dual differential output port.

21. The radio frequency mixer of claim 19, wherein the plurality of first switches and the second switches of the plurality of parallel second switch pairs comprise:
a first type of transistor;
a second type of transistor; or
a combination of the first type of transistor and the second type of transistor,
wherein the first type of transistor is closed by an application of a high voltage level and opened by an application of a low voltage level, and
wherein the second type of transistor is closed by an application of a low voltage level and opened by an application of a high voltage level.

22. A method of mixing radio frequency signals, comprising:
receiving, via a first switching module, first, second, third, and fourth phased half duty cycle clock signals;
switching, via the first switching module:
a differential input signal based on the third phased half duty cycle clock signal and the fourth phased half duty cycle clock signal to generate first switching outputs,
the differential input signal based on the third phased half duty cycle clock signal and the fourth phased half duty cycle clock signal to generate second switching outputs,
the differential input signal based on the first phased half duty cycle clock signal and the second phased half duty cycle clock signal to generate third switching outputs, and
the differential input signal based on the first phased half duty cycle clock signal and the second phased half duty cycle clock signal to generate fourth switching outputs;
receiving, via a second switching module, the first, second, third, and fourth phased half duty cycle clock signals; and generating, via the second switching module, a differential in-phase output signal and a differential quadrature-phase output signal on a dual differential output port by switching:
the first switching outputs based on the first phased half duty cycle clock signal and the second phased half duty cycle clock signal,
the second switching outputs based on the first phased half duty cycle clock signal and the second phased half duty cycle clock signal,
the third switching outputs based on the third phased half duty cycle clock signal and the fourth phased half duty cycle clock signal, and
the fourth switching outputs based on the third phased half duty cycle clock signal and the fourth phased half duty cycle clock signal.

23. The method of claim 22, wherein the first, second, third, and fourth phased half duty cycle clock signals are of the same frequency and out of phase by a multiple of ninety degrees with respect to each other.

24. The method of claim 22, wherein:
the differential input signal is a radio frequency differential input signal;
the differential in-phase output signal is an intermediate frequency differential in-phase output signal; and
the differential quadrature-phase output signal is an intermediate frequency differential quadrature-phase output signal.

25. The method of claim 22, wherein:
the differential input signal is an intermediate frequency differential input signal;
the differential in-phase output signal is a radio frequency differential in-phase output signal; and
the differential quadrature-phase output signal is a radio frequency differential quadrature-phase output signal.

26. The method of claim 22,
wherein the first switching module comprises a plurality of first switches comprising first control inputs, wherein a first subset of first switches of the plurality of first switches are coupled in parallel to a positive input of a differential input port, a second subset of first switches of the plurality of first switches are coupled in parallel to a negative input of the differential input port, a third subset of first switches of the plurality of first switches are coupled in parallel to the positive input of the differential input port, and a fourth subset of first switches of the plurality of first switches are coupled in parallel to the negative input of the differential input port, and
wherein the second switching module comprises a plurality of parallel second switch pairs comprising second control inputs, wherein each pair of parallel second switches of a first subset of second switch pairs of the plurality of parallel second switch pairs is coupled in series to one respective first switch of the first subset of first switches and to the dual differential output port, wherein each pair of parallel second switches of a second subset of second switch pairs of the plurality of parallel second switch pairs is coupled in series to one respective first switch of the second subset of first switches and to the dual differential output port, wherein each pair of parallel second switches of a third subset of second switch pairs of the plurality of parallel second switch pairs is coupled in series to one respective first switch of the third subset of first switches and to the dual differential output port, and wherein each pair of parallel second switches of a fourth subset of second switch pairs of the plurality of parallel second switch pairs is coupled in series to one respective first switch of the fourth subset of first switches and to the dual differential output port.

27. The method of claim 26,
wherein the first control inputs of the third subset of first switches are configured to receive the first phased half duty cycle clock signal and the second phased half duty cycle clock signal to facilitate switching at the third subset of first switches, and wherein the second control inputs of the third subset of second switch pairs are configured to receive the third phased half duty cycle clock signal and the fourth phased half duty cycle clock signal to facilitate switching at the third subset of second switch pairs,
wherein the first control inputs of the fourth subset of first switches are configured to receive the first phased half duty cycle clock signal and the second phased half duty cycle clock signal to facilitate switching at the fourth subset of first switches, and wherein the second control inputs of the fourth subset of second switch pairs are configured to receive the third phased half duty cycle clock signal and the fourth phased half duty cycle clock signal to facilitate switching at the fourth subset of second switch pairs,
wherein the first control inputs of the first subset of first switches are configured to receive the third phased half duty cycle clock signal and the fourth phased half duty cycle clock signal to facilitate switching at the first subset of first switches, and wherein the second control inputs of the first subset of second switch pairs are configured to receive the first phased half duty cycle clock signal and the second phased half duty cycle clock signal to facilitate switching at the first subset of second switch pairs,
wherein the first control inputs of the second subset of first switches are configured to receive the third phased half duty cycle clock signal and the fourth phased half duty cycle clock signal to facilitate switching at the second subset of first switches, and wherein the second control inputs of the second subset of second switch pairs are configured to receive the first phased half duty cycle clock signal and the second phased half duty cycle clock signal to facilitate switching at the second subset of second switch pairs, and
wherein the switching at the first subset of first switches, the switching at the first subset of second switch pairs, the switching at the second subset of first switches, the switching at the second subset of second switch pairs, the switching at the third subset of first switches, the switching at the third subset of second switch pairs, the switching at the fourth subset of first switches, and the switching at the fourth subset of second switch pairs convolves the differential input signal on the differential input port with the first, second, third, and fourth phased half duty cycle clock signals to concurrently generate the differential in-phase output signal and the differential quadrature-phase output signal on the dual differential output port.

28. The method of claim 26, wherein the plurality of first switches and the second switches of the plurality of parallel second switch pairs comprise:
a first type of transistor;
a second type of transistor; or
a combination of the first type of transistor and the second type of transistor, wherein the first type of transistor is closed by an application of a high voltage level and opened by an application of a low voltage level, and wherein the second type of transistor is closed by an application of a low voltage level and opened by an application of a high voltage level.

\* \* \* \* \*